(12) United States Patent
Chao et al.

(10) Patent No.: US 12,456,617 B2
(45) Date of Patent: Oct. 28, 2025

(54) SEMICONDUCTOR DEVICE PRE-CLEANING

(71) Applicant: Taiwan Semiconductor Manufacturing Company, Ltd., Hsinchu (TW)

(72) Inventors: Yi-Hsiang Chao, New Taipei (TW); Chih-Sheng Chou, Changhua County (TW); Shu-Ting Yang, Taipei (TW); Ting-Wei Weng, Hsinchu (TW); Peng-Hao Hsu, Hsinchu (TW); Chun-Hsien Huang, Hsinchu (TW); Hung-Hsu Chen, Tainan (TW); Hung-Chang Hsu, Kaohsiung (TW); Chih-Wei Chang, Hsinchu (TW); Ming-Hsing Tsai, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 621 days.

(21) Appl. No.: 17/804,447

(22) Filed: May 27, 2022

(65) Prior Publication Data

US 2023/0386822 A1  Nov. 30, 2023

(51) Int. Cl.
*H10K 71/40* (2023.01)
*H01L 21/02* (2006.01)
*H01L 21/285* (2006.01)

(52) U.S. Cl.
CPC .. *H01L 21/02074* (2013.01); *H01L 21/28518* (2013.01)

(58) Field of Classification Search
CPC ......... H01L 21/02063; H01L 21/02074; H01L 21/28518; H01L 21/76814; H01L 2221/1063
See application file for complete search history.

(56) References Cited

U.S. PATENT DOCUMENTS

| | | | |
|---|---|---|---|
| 11,232,947 B1 * | 1/2022 | Chu | ................. H01L 21/02046 |
| 2009/0191703 A1 | 7/2009 | Lu et al. | |
| 2020/0066587 A1 | 2/2020 | Chi et al. | |
| 2021/0327760 A1 | 10/2021 | Ho et al. | |

* cited by examiner

*Primary Examiner* — Jay C Kim
*Assistant Examiner* — Joshua Scott Wyatt
(74) *Attorney, Agent, or Firm* — Harrity & Harrity, LLP

(57) ABSTRACT

A pre-cleaning technique described herein may be used to remove native oxides and/or other contaminants from a semiconductor device in a manner in which the likelihood of chopping, clipping, and/or sidewall spacer thickness reduction is reduced. As described herein, a protection layer is formed on a capping layer over a gate structure of a transistor. A pre-cleaning operation is then performed to remove native oxides from the top surface of a source/drain region of the transistor. In the pre-cleaning operation, the protection layer is consumed instead of the material of the capping layer. In this way, the use of the protection layer reduces the likelihood of removal of material from the capping layer and/or reduces the amount of material that is removed from the capping layer during the pre-cleaning operation.

20 Claims, 31 Drawing Sheets

SEMICONDUCTOR DEVICE PRE-CLEANING

BACKGROUND

As processing nodes for transistors shrink, and as transistor density increases, the available space between the gates of the transistors and/or between a gate and a source/drain region of the transistors decrease. A self-aligned contact (SAC) process is a process by which a contact for a source/drain region of a transistor is deposited without the use of additional photoresist-based masks, which enables the size and pitch of contacts in the transistor to be reduced. Instead, capping layers are formed over the gates of the transistor to protect the gates during formation of the contact. The capping layers provide electrical isolation between adjacent gates and/or between an adjacent gate and source/drain region. The capping layers also function as sacrificial hard masks for selective deposition and planarization of the material of the contact.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
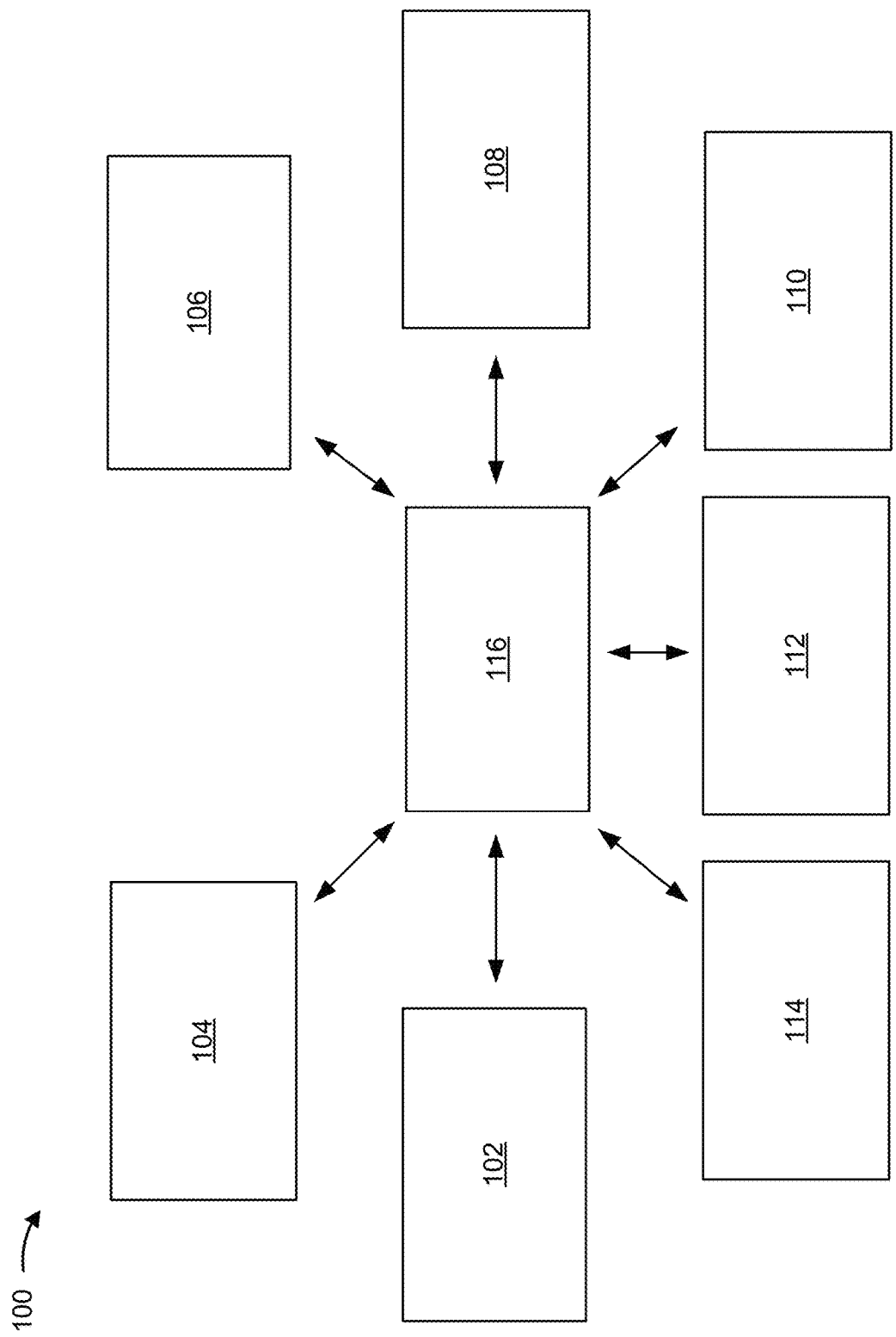
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A metal silicide layer may be formed on a top surface of a source/drain region of a transistor prior to formation of a source/drain contact to provide decreased resistance between the source/drain region and the source/drain contact. The top surface of the source/drain region may be prepared for the metal silicide layer by performing a pre-clean operation to remove native oxides (e.g., oxides that naturally form on the top surface of the source/drain region when exposed to atmospheric oxygen) and other contaminates from the top surface of the source/drain region. After the pre-clean operation, a conductive material is deposited on the source/drain region, and the transistor is subjected to a high-temperature anneal which causes the conductive material to react with silicon of the source/drain region to form the metal silicide layer. A source/drain contact may then be formed over the metal silicide layer.

The pre-clean operation may result in removal of some of the material of capping layers over the gate structures of the transistor. The removal of the material of the capping layers may be referred to as chopping or clipping. Moreover, the pre-clean operation may result in removal of all or a portion of sidewall spacers on the sidewalls of the gate structures. Chopping or clipping, and the reduction in sidewall spacer thickness, may result in a source/drain contact protruding toward an adjacent gate structure and/or an adjacent source/drain contact.

The protrusions described above that result from chopping or clipping may reduce the electrical isolation provided by the capping layers, such as gate-to-gate electrical isolation and/or gate-to-source/drain electrical isolation. For example, removal of the material of the capping layers may result in a contact protruding toward an adjacent gate structure or an adjacent contact, which may cause and/or increase current leakage in the transistor. In particular, the reduced distance between the contact and the adjacent gate structure and/or the adjacent contact reduces the difficulty for electrons to tunnel between the contact and the adjacent gate structure and/or the adjacent contact. Moreover, the protrusions described above that result from a reduction in sidewall spacer thickness may increase the likelihood of gate-to-source/drain shorting and/or source/drain-to-source/drain shorting, which may reduce yield of transistors formed on a substrate or wafer.

Some implementations described herein provide a pre-cleaning technique that may be used to remove native oxides and/or other contaminants from a semiconductor device in a manner in which the likelihood of chopping, clipping, and/or sidewall spacer thickness reduction are reduced. In some implementations, a protection layer is formed on a capping layer over a gate structure of a transistor. A pre-cleaning operation is then performed to remove native oxides from the top surface of a source/drain region of the transistor. After the pre-cleaning operation, metal silicide layer may be formed over the source/drain region. A conductive material may be deposited over the metal silicide layer and planarized to form a source/drain contact over the source/drain region for the transistor.

In the pre-cleaning operation, the protection layer is consumed (e.g., removed by pre-cleaning chemicals) instead of the material of the capping layers. In this way, the use of the protection layer reduces the likelihood of removal of material from the capping layers and/or reduces the amount of material that is removed from the capping layers during the pre-cleaning operation. Accordingly, the use of the protection layer may reduce the occurrence of chopping or clipping in the capping layer, which may enable the capping layer to provide increased electrical isolation as a result of a reduced likelihood of a source/drain contact protrusion forming in the transistor. Moreover, the protection layer may also be formed on the sidewall spacers of the gate structure, and may protect the sidewall spacers from being thinned during the pre-cleaning operations. This may enable the sidewall spacers to provide increased electrical isolation in the transistor. The increased electrical isolation may reduce current leakage in the transistor and may reduce the likelihood of gate-to-source/drain shorting or source/drain-to-source/drain shorting, which may increase yield of transistors formed on a substrate or wafer.

FIG. 1 is a diagram of an example environment 100 in which systems and/or methods described herein may be implemented. As shown in FIG. 1, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, a pre-clean tool 114, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The pre-clean tool 114 is a semiconductor processing tool that is capable of performing a cleaning operation to clean a semiconductor device and/or one or more structures thereon. The pre-clean tool 114 may clean a semiconductor device to remove residual materials from the semiconductor device (e.g., after another semiconductor processing operation) and/or to remove native oxides and other native materials from the semiconductor device, and/or may perform another type of cleaning operation. For example, the pre-clean tool 114 may perform an epitaxial pre-clean operation, a silicide pre-clean operation, and/or another type of pre-clean operation to remove native oxides and/or other contaminants from a top surface of a source/drain region to prepare the top surface of the source/drain region for formation of metal silicide layer thereon.

The pre-clean tool 114 may clean a semiconductor device using one or more dry (e.g., gas-based) cleaning chemicals, one or more wet cleaning chemicals, and/or a plasma. The pre-clean tool 114 may include a Collins pre-clean tool, a silicon cobalt nickel (SiCoNi) pre-clean tool, or another type of pre-clean tool. In some implementations, the pre-clean tool 114 may be part of another semiconductor processing tool (e.g., the deposition tool 102) such that a semiconductor device can remain in the same processing chamber or controlled environment for multiple semiconductor processing steps, which prevents additional oxide formation that otherwise might occur during transport of the semiconductor device from the pre-clean tool 114 to another semiconductor processing tool.

Wafer/die transport tool 116 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-114, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 116 may be a programmed device that is configured to travel a particular path and/or may operate semi-autonomously or autonomously. In some implementations, the environment 100 includes a plurality of wafer/die transport tools 116.

The wafer/die transport tool 116 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 116 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 116 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

In some implementations, one or more of the semiconductor processing tools 102-114 and/or the wafer/die transport tool 116 may perform one or more semiconductor processing operations described herein. For example, one or more of the semiconductor processing tools 102-114 and/or the wafer/die transport tool 116 may form a protection layer on a dielectric capping layer that is over a metal gate structure of a semiconductor device; and/or may perform a pre-clean operation to remove native oxides from a top surface of a source/drain region that is side-by-side with the metal gate structure, where the protection layer resists removal of material from the dielectric capping layer during the pre-clean operation, among other examples.

As another example, one or more of the semiconductor processing tools 102-114 and/or the wafer/die transport tool 116 may form a protection layer on a dielectric capping layer that is over a metal gate structure of a semiconductor device, and on a top surface of an epitaxial region that is side-by-side with the metal gate structure; may perform a pre-clean operation to remove native oxides from the top surface of the epitaxial region, where the protection layer is removed from the top surface of the epitaxial region during the pre-clean operation to expose the top surface of the epitaxial region to enable the native oxides to be removed from the top surface of the epitaxial region during the pre-clean operation, and where the protection layer resists removal of material from the dielectric capping layer during the pre-clean operation; and/or may form a metal silicide layer on the top surface of the epitaxial region after the pre-clean operation, among other examples.

As another example, one or more of the semiconductor processing tools 102-114 and/or the wafer/die transport tool 116 may form a protection layer on a dielectric capping layer that is over a metal gate structure of a semiconductor device; may perform a pre-clean operation to remove native oxides from a top surface of a source/drain region that is side-by-side with the metal gate structure, where the protection layer resists removal of material from the dielectric capping layer during the pre-clean operation; may form a metal silicide layer on the top surface of the source/drain region after the pre-clean operation; may deposit a conductive material over the metal silicide layer; and/or may perform a planarization operation to planarize the conductive material to form a conductive structure over the metal silicide layer, where the protection layer is removed from the dielectric capping layer during the planarization operation, among other examples.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
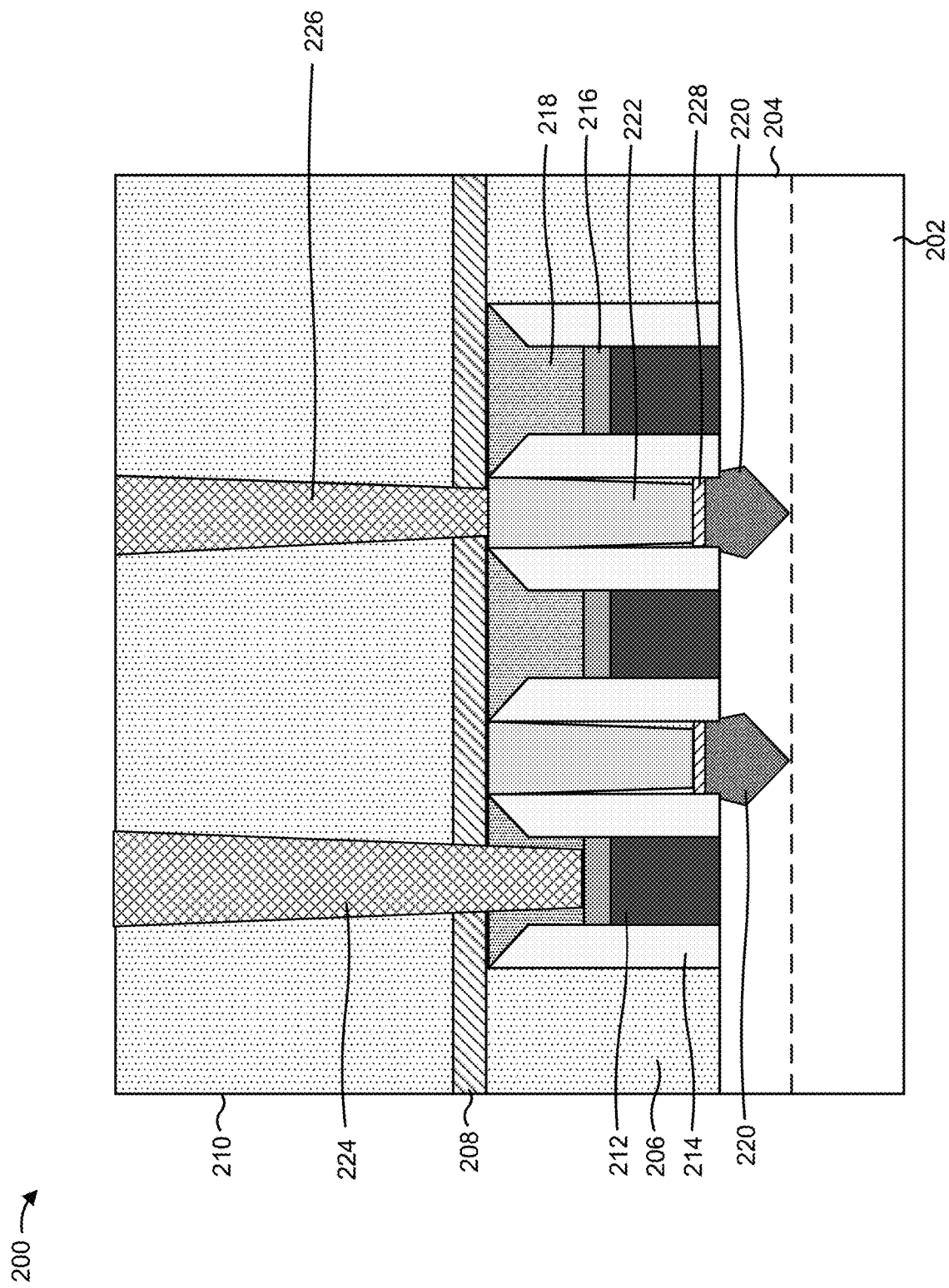
FIG. 2 is a diagram of an example semiconductor device described herein.

FIG. 2 is a diagram of a portion of a semiconductor device 200 described herein. The portion of the semiconductor device 200 includes an example of a memory device (e.g., a static random access memory (SRAM), a dynamic random access memory (DRAM)), a logic device, a processor, a ring oscillator (RO) device, an input/output (I/O) device, or another type of semiconductor device that includes one or more transistors.

As shown in FIG. 2, the semiconductor device 200 includes a substrate 202, which includes a silicon (Si) substrate, a substrate formed of a material including silicon, a III-V compound semiconductor material substrate such as gallium arsenide (GaAs), a silicon on insulator (SOI) substrate, a silicon germanium (SiGe) substrate, or another type of semiconductor substrate. In some implementations, a fin structure 204 is formed in the substrate 202. In some implementations, a plurality of fin structures 204 are included in the substrate 202. In this way, the transistors included on the semiconductor device 200 include fin field-effect transistors (finFETs). In some implementations, the semiconductor device 200 includes other types of transistors, such as gate all around (GAA) transistors (e.g., nanosheet transistors, nanowire transistors, nanostructure transistors), planar transistors, and/or other types of transistors. The fin structures 204 are electrically isolated by intervening shallow trench isolation (STI) structures or regions (not shown). The STI structures may be etched back such that the height of the STI structures is less than the height of the fin structures 204. In this way, the gate structures of the transistors may be formed around at least three sides of the fin structures 204.

As shown in FIG. 2, a plurality of layers are included on the substrate 202 and/or on the fin structures 204, including a dielectric layer 206, an etch stop layer (ESL) 208, and a dielectric layer 210, among other examples. The dielectric layers 206 and 210 are included to electrically isolate various structures of the semiconductor device 200. The dielectric layers 206 and 210 include interlayer dielectric layers (ILDs). For example, the dielectric layer 206 may include an ILD0 layer, and the dielectric layer 210 may include an ILD1 layer or an ILD2 layer (in some cases, the ILD1 layer is skipped).

The thickness of the dielectric layer 210 may be included in a range of approximately 3 nanometers to approximately 40 nanometers to provide sufficient height or depth for forming the interconnect structures of the semiconductor device 200 without unduly increasing the height of the semiconductor device 200. However, other values for the thickness of the ESL 208 are within the scope of the present disclosure. The dielectric layers 206 and 210 each include (e.g., either the same material or different materials) a lanthanum oxide ($La_xO_y$), an aluminum oxide ($Al_xO_y$) a yttrium oxide ($Y_xO_y$), a tantalum carbon nitride (TaCN), a zirconium silicide ($ZrSi_x$), a silicon oxycarbonitride (SiOCN), a silicon oxycarbide (SiOC), a silicon carbon nitride (SiCN), a zirconium nitride (ZrN), a zirconium aluminum oxide (ZrAlO), a titanium oxide ($Ti_xO_y$), a tantalum oxide ($Ta_xO_y$), a zirconium oxide ($Zr_xO_y$), a hafnium oxide ($Hf_xO_y$), a silicon nitride ($Si_xN_y$), a hafnium silicide ($HfSi_x$), an aluminum oxynitride (AlON), a silicon oxide ($Si_xO_y$), a silicon carbide (SiC), a zinc oxide ($Zn_xO_y$), and/or another dielectric material.

The thickness of the ESL 208 may be included in a range of approximately 3 nanometers to approximately 20 nanometers to provide sufficient etch selectivity without unduly increasing the height of the semiconductor device 200. However, other values for the thickness of the ESL 208 are within the scope of the present disclosure. The ESL 208 includes a layer of material that is configured to permit various portions of the semiconductor device 200 (or the layers included therein) to be selectively etched or protected from etching to form one or more of the structures included on the substrate 202. The ESL 208 may include a lanthanum oxide ($La_xO_y$), an aluminum oxide ($Al_xO_y$), a yttrium oxide ($Y_xO_y$), a tantalum carbon nitride (TaCN), a zirconium silicide ($ZrSi_x$), a silicon oxycarbonitride (SiOCN), a silicon oxycarbide (SiOC), a silicon carbon nitride (SiCN), a zirconium nitride (ZrN), a zirconium aluminum oxide (ZrAlO), a titanium oxide ($Ti_xO_y$), a tantalum oxide ($Ta_xO_y$), a zirconium oxide ($Zr_xO_y$), a hafnium oxide ($Hf_xO_y$), a silicon nitride ($Si_xN_y$), a hafnium silicide ($HfSi_x$), an aluminum oxynitride (AlON), a silicon oxide ($Si_xO_y$), a silicon carbide (SiC), and/or a zinc oxide ($Zn_xO_y$), among other examples.

As further shown in FIG. 2, a plurality of gate stacks may be included over, on, and/or around a portion of the fin structure 204. The gate stacks include a metal gate (MG) structure 212 between sidewall spacers 214, a metal capping layer 216 over and/or on the metal gate structure 212, and a dielectric capping layer 218 over and/or on the metal capping layer 216. The metal gate structures 212 include a conductive metallic material (or metal alloy) such as cobalt (Co), tungsten (W), ruthenium (Ru), molybdenum (Mo), titanium (Ti), titanium nitride (TiN), another metallic material, and/or a combination thereof. The sidewall spacers 214 are included to electrically isolate the gate stacks from adjacent and/or side-by-side conductive structures included on the semiconductor device 200, and thus may be referred to as gate spacers. The sidewall spacers 214 include a silicon oxide ($SiO_x$), a silicon nitride ($Si_xN_y$), a silicon oxy carbide (SiOC), a silicon oxycarbonitride (SiOCN), and/or another suitable material. The tops of the sidewall spacers 214 may be angled or sloped. For example, the top of a sidewall spacer 214 may be angled such that the height of the top of the sidewall spacer 214 increases from a side of the sidewall spacer 214 that faces an associated metal gate structure 212 to an opposing side of the sidewall spacer 214 that faces a source/drain contact that is next to the metal gate structure 212. The angled or sloped tops of the sidewall spacers 214 may result from etching of the sidewall spacers 214 during a replacement gate process to replace dummy gate structures (e.g., polysilicon placeholder structures) with the metal gate structures 212.

The metal capping layer 216 is included to protect the metal gate structure 212 from oxidization and/or etch damage during processing of the semiconductor device 200, which preserves the low contact resistance of the metal gate structure 212. The metal capping layer 216 include a conductive metallic material (or metal alloy) such as cobalt (Co), tungsten (W) (e.g., fluorine free tungsten (FFW)), ruthenium (Ru), molybdenum (Mo), titanium (Ti), titanium nitride (TiN), another metallic material, and/or a combination thereof. The dielectric capping layer 218 includes a dielectric material such as a lanthanum oxide ($La_xO_y$), an aluminum oxide ($Al_xO_y$), a yttrium oxide ($Y_xO_y$), a tantalum carbon nitride (TaCN), a zirconium silicide ($ZrSi_x$), a silicon oxycarbonitride (SiOCN), a silicon oxycarbide (SiOC), a silicon carbon nitride (SiCN), a zirconium nitride (ZrN), a zirconium aluminum oxide (ZrAlO), a titanium oxide ($Ti_xO_y$), a tantalum oxide ($Ta_xO_y$), a zirconium oxide ($Zr_xO_y$), a hafnium oxide ($Hf_xO_y$), a silicon nitride ($Si_xN_y$), a hafnium silicide ($HfSi_x$), an aluminum oxynitride (AlON), a silicon oxide ($Si_xO_y$), a silicon carbide (SiC), and/or a zinc oxide ($Zn_xO_y$), among other examples.

The dielectric capping layer 218 may be referred to as a self-aligned contact (SAC) layer or a sacrificial layer that protects the gate stacks from processing damage during processing of the semiconductor device 200 and functions as a hard mask for deposition of the source/drain contacts of the semiconductor device 200. In some implementations, the dielectric capping layer 218 includes a first portion (e.g., a lower portion) between a pair of sidewall spacers 214, where the first portion extends from a top surface of an associated metal capping layer 216 to the same approximately height or top surface level of the sidewall spacers 214. In these implementations, the dielectric capping layer 218 further includes a second portion (e.g., an upper portion) that extends above the first portion and over the top surfaces of the sidewall spacers 214, as shown in FIG. 2. In some other implementations, the sidewall spacers 214 fully extend between the fin structure 204 (or the substrate 202) and the ESL 208, and the dielectric capping layer 218 is fully contained between the sidewall spacers 214 between the top surface of the associated metal capping layer 216 and the bottom surface of the ESL 208.

As further shown in FIG. 2, a plurality of source/drain regions 220 are included on and/or around portions of the fin structure 204. The source/drain regions 220 include p-doped and/or n-doped epitaxial (epi) regions that are grown and/or otherwise formed by epitaxial growth. In some implementations, the source/drain regions 220 are formed over etched portions of the fin structure 204. The etched portions may be formed by strained source drain (SSD) etching of the fin structure 204 and/or another type etching operation.

The source/drain regions 220 are formed in the recessed portions of the fin structure 204 by an epitaxy or epitaxial (epi) process. In some implementations, the epi process includes a selective epitaxy growth (SEG) process, CVD deposition techniques (e.g., vapor-phase epitaxy (VPE) and/or ultra-high vacuum CVD (UHV-CVD)), molecular beam epitaxy, and/or another suitable epi process. The epi process includes the use gaseous and/or liquid precursors, which interact with the composition of fin structure 204. The deposited semiconductor material is different from the semiconductor material of the fin structure 204. Accordingly, channel regions of the semiconductor device 200 along the fin structure 204 are strained or stressed to enable carrier mobility in the semiconductor device 200 to enhance device performance.

Source/drain contacts (MDs) 222 are included over and/or on the source/drain regions 220. The source/drain contacts 222 include conductive metallic material (or metal alloy) such as cobalt (Co), tungsten (W), ruthenium (Ru), copper (Cu), another metallic material, and/or a combination thereof.

In some implementations, a contact etch stop layer (CESL) is included between the sidewall spacers of the gate stacks and the source/drain contacts 222. The CESL may be included to provide etch selectivity or etch stop point for the sidewall spacers 214 during an etch operation to form openings in which the source/drain contacts 222 are formed.

As further shown in FIG. 2, the metal gate structures 212 (e.g., either directly or via the metal capping layer 216) and the source/drain contacts 222 are electrically and/or physically connected to interconnect structures. For example, a metal gate structure 212 may be electrically connected to a gate interconnect structure 224 (e.g., a gate via, via-to-gate, or VG). The metal gate structure 212 is electrically and/or physically connected to the gate interconnect structure 224 directly, via the intervening metal capping layer 216, and/or by a metal gate contact (MP). As another example, a source/drain contact 222 may be electrically and/or physically connected to a source/drain interconnect structure 226 (e.g., a source/drain via, via-to-source/drain, or VD).

The interconnect structures (e.g., the gate interconnect structure 224, the source/drain interconnect structure 226, among other examples) electrically connect the transistors on the semiconductor device 200 and/or electrically connect the transistors to other areas and/or components of the semiconductor device 200. In some implementations, the interconnect structures electrically connect the transistors to a back end of line (BEOL) region of the semiconductor device 200. The gate interconnect structure 224 and the source/drain interconnect structure 226 include a conductive material such as tungsten, cobalt, ruthenium, copper, and/or another type of conductive material. The gate interconnect structure 224 includes a conductive material such as tungsten (W), ruthenium (Ru), molybdenum (Mo), cobalt (Co), copper (Cu), titanium (Ti), aluminum (Al), another conductive material, a conductive material composition, or a combination thereof. The source/drain interconnect structure 226 includes a conductive material such as tungsten (W), ruthenium (Ru), molybdenum (Mo), cobalt (Co), copper (Cu), titanium (Ti), aluminum (Al), another conductive material, a conductive material composition, or a combination thereof.

As described herein, the gate interconnect structure 224 may be formed using a dry-wet-dry processing flow that includes a multi-step (e.g., two-step) etch technique for forming an opening in which the gate interconnect structure 224 is formed. The multi-step etch technique may include performing one or more first etch operations to etch the dielectric layer 210 (and in some cases, the ESL 208) to form the opening to a first depth, and performing a second etch operation to form the opening to a second depth corresponding to a top surface of a metal capping layer 216 over a metal gate structure 212. A wet cleaning operation may be performed between the one or more first etch operations and the second etch operation to facilitate removal of residual materials and/or native materials from the opening to increase the performance of the gate interconnect structure 224 and to reduce defect formation in the semiconductor device 200. In some implementations, a dry ashing operation is performed in the same processing chamber 116 of the etch tool 108 as the one or more first etch operations, which decreases the exposure of the semiconductor device 200 to environmental conditions that might otherwise increase exposure to oxidation and other types of contamination.

A metal silicide layer 228 may be included between the source/drain regions 220 and the source/drain contacts 222 of the semiconductor device 200. The metal silicide layer 228 may be included to decrease contact resistance between a source/drain region 220 and an associated source/drain contact 222 and/or to decrease the Schottky barrier height (SBH) between the source/drain region 220 and the source/drain contact 222. The metal silicide layer 228 may include a metal silicide, such as a titanium silicide ($TiSi_x$), a nickel silicide ($Ni_xSi$), or another metal silicide.

As indicated above, FIG. 2 is provided as an example. Other examples may differ from what is described with regard to FIG. 2.

Figure 3B:
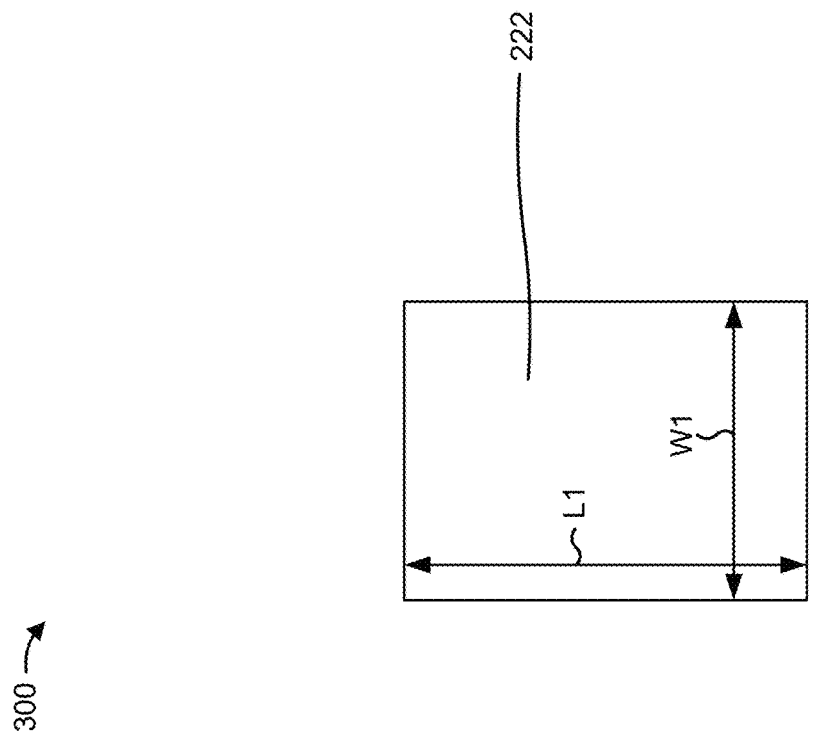
FIGS. 3A and 3B are diagrams of an example implementation of semiconductor structures described herein.
Figure 3A:
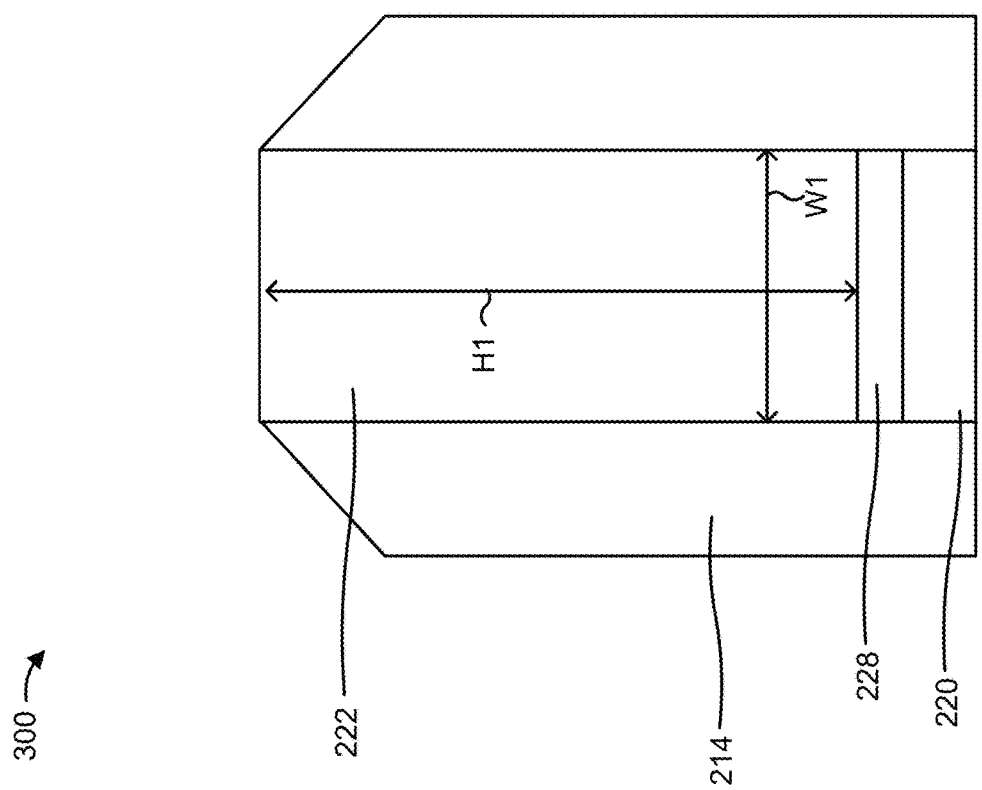

FIGS. 3A and 3B are diagrams of an example implementation 300 of semiconductor structures described herein. The example implementation 300 includes various dimensions and/or parameters of a source/drain contact 222 included in the semiconductor device 200. The source/drain contact 222 may be included over and/or on a metal silicide layer 228, over a source/drain region 220, and between sidewall spacers 214.

FIG. 3A illustrates a cross-sectional view of the source/drain contact 222. As shown in FIG. 3A, an example dimension includes a width (W1) of the source/drain contact 222. The width (W1) of the source/drain contact 222 may correspond to a bottom critical dimension of the source/drain contact 222. In some implementations, the width (W1)

of the source/drain contact 222 is included in a range of approximately 10 nanometers to approximately 40 nanometers to enable increased device density for the semiconductor device 200 while reducing a likelihood of under etching of the source/drain contact 222 and/or the source/drain interconnect structure 226. However, other values for the width (W1) are within the scope of the present disclosure.

As further shown in FIG. 3A, an example dimension includes a height (H1) of the source/drain contact 222. In some implementations, the height (H1) of the source/drain contact 222 is included in a range of approximately 30 nanometers to approximately 150 nanometers to enable the source/drain contact 222 to electrically connect with the source/drain region 220 and an associated source/drain interconnect structure 226. However, other values for the height (H1) are within the scope of the present disclosure.

FIG. 3B illustrates a top-down view of the source/drain contact 222. FIG. 3B illustrates the width (W1) of the source/drain contact 222 and a length (L1) of the source/drain contact 222. In some implementations, the length (L1) of the source/drain contact 222 is included in a range of approximately 20 nanometers to approximately 300 nanometers, or in a range of approximately 500 nanometers to approximately 1,500 nanometers to enable increased device density for the semiconductor device 200 while providing sufficient contact area on the source/drain contact 222 for landing an associated source/drain interconnect structure 226 of the source/drain contact 222. However, other values for the length (L1) are within the scope of the present disclosure.

As indicated above, FIGS. 3A and 3B are provided as examples. Other examples may differ from what is described with regard to FIGS. 3A and 3B.

FIGS. 4A-4H are diagrams of an example implementation 400 described herein. The example implementation 400 includes an example of performing a pre-clean operation to remove native oxides from the semiconductor device 200. For example, the pre-cleaning operation may be performed to remove native oxides from the top surfaces of the source/drain regions 220 of the semiconductor device 200 in preparation for forming the metal silicide layer 228 on the top surfaces of the source/drain regions 220. Moreover, the example implementation 400 includes an example of forming a protection layer on the dielectric capping layers 218 of the semiconductor device 200. The protection layer protects the dielectric capping layers 218 from being etched (and thus, protects against material removal from the dielectric capping layers 218) during the pre-cleaning operation. This reduces, minimizes, and/or prevents chopping or clipping of the dielectric capping layers 218 from occurring during the pre-cleaning operation.

Figure 4A:
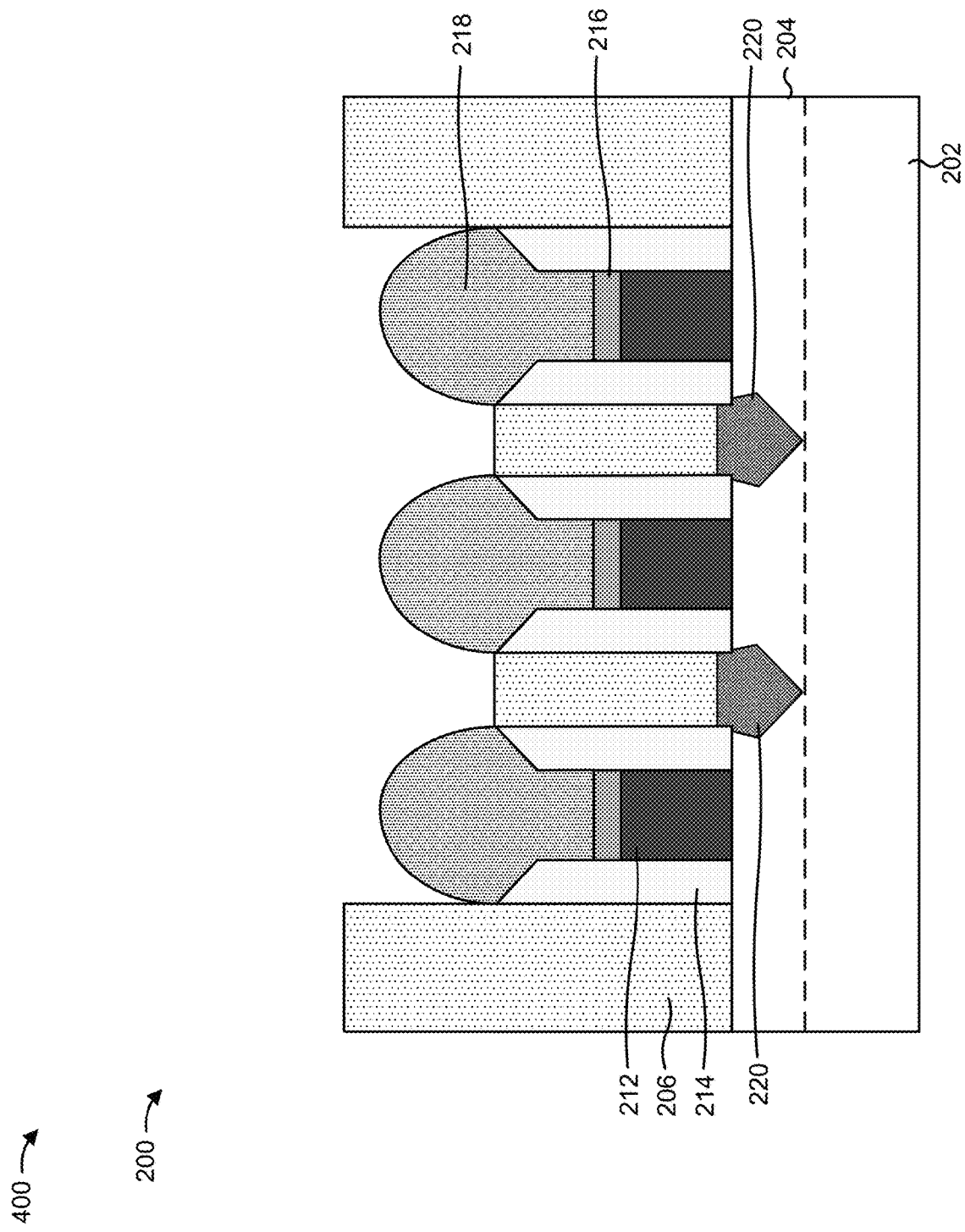
FIGS. 4A-4H, 5A-5D, and 6A-6F are diagrams of example implementations described herein.

Turning to FIG. 4A, the semiconductor processing operations described in connection with the example implementation 400 may be performed after one or more semiconductor processing operations for the semiconductor device 200. For example, one or more of the semiconductor processing tools 102-114 may form a fin structure 204 in the substrate 202 of the semiconductor device 200. As another example, one or more of the semiconductor processing tools 102-114 may form source/drain regions 220 in and/or on the fin structure 204. As another example, one or more of the semiconductor processing tools 102-114 may form the dielectric layer 206 over the substrate 202 and over the source/drain regions 220. As another example, one or more of the semiconductor processing tools 102-114 may form the sidewall spacers 214, the metal gate structures 212, the metal capping layers 216, and the dielectric capping layers 218. The dielectric capping layers 218 may include rounded or curved top surfaces after deposition of the dielectric capping layers 218.

Figure 4B:
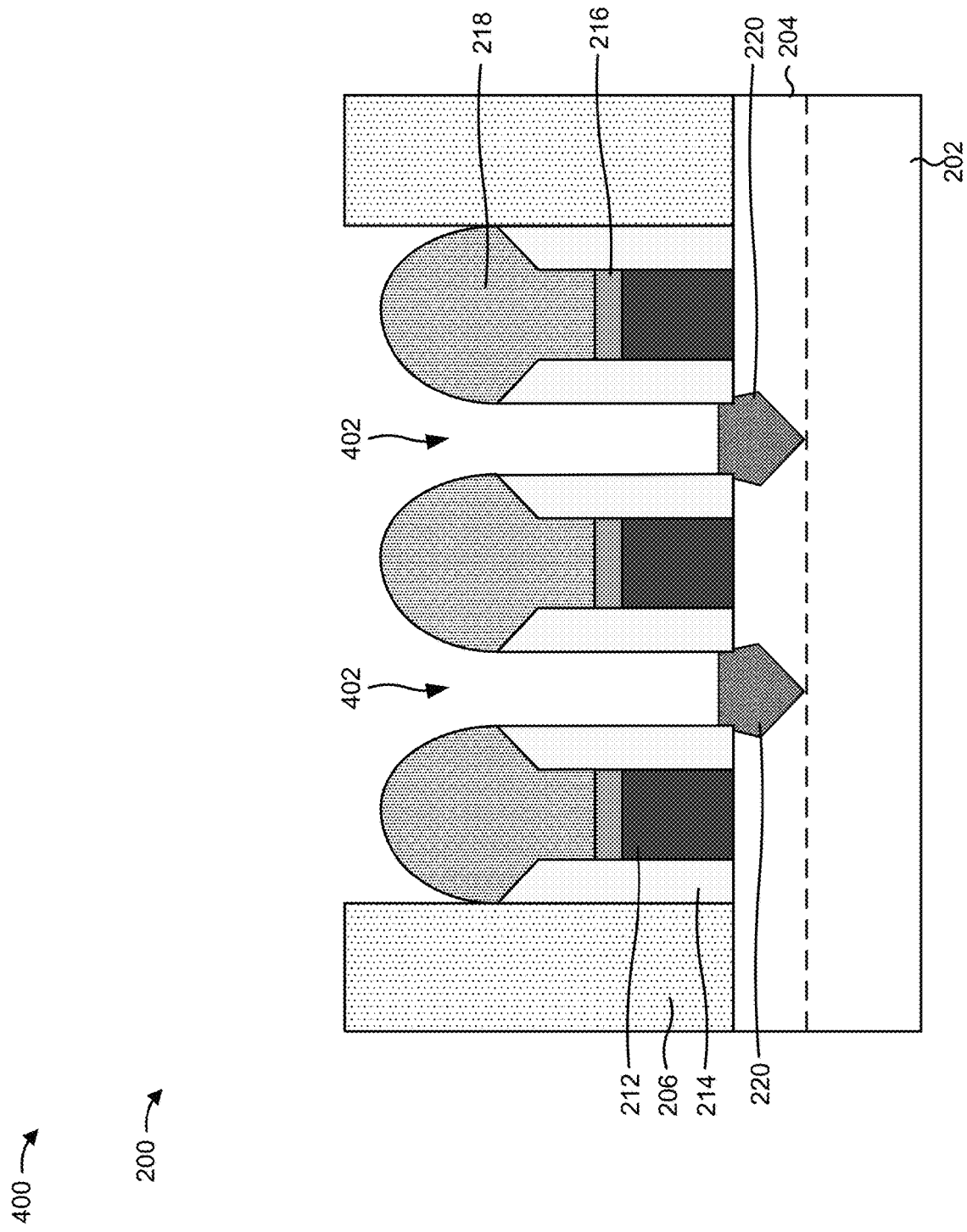

As shown in FIG. 4B, portions of the dielectric layer 206 over the source/drain regions 220 may be removed to form openings (or recesses) 402 over the source/drain regions 220. This exposes the top surfaces of the source/drain regions 220 through the openings 402. In some implementations, a pattern in a photoresist layer is used to form the openings 402. In these implementations, the deposition tool 102 forms the photoresist layer on the dielectric layer 206 and on the dielectric capping layers 218. The exposure tool 104 exposes the photoresist layer to a radiation source to pattern the photoresist layer. The developer tool 106 develops and removes portions of the photoresist layer to expose the pattern. The etch tool 108 etches into the dielectric layer 206 to form the openings 402. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the openings 402 based on a pattern.

Figure 4C:
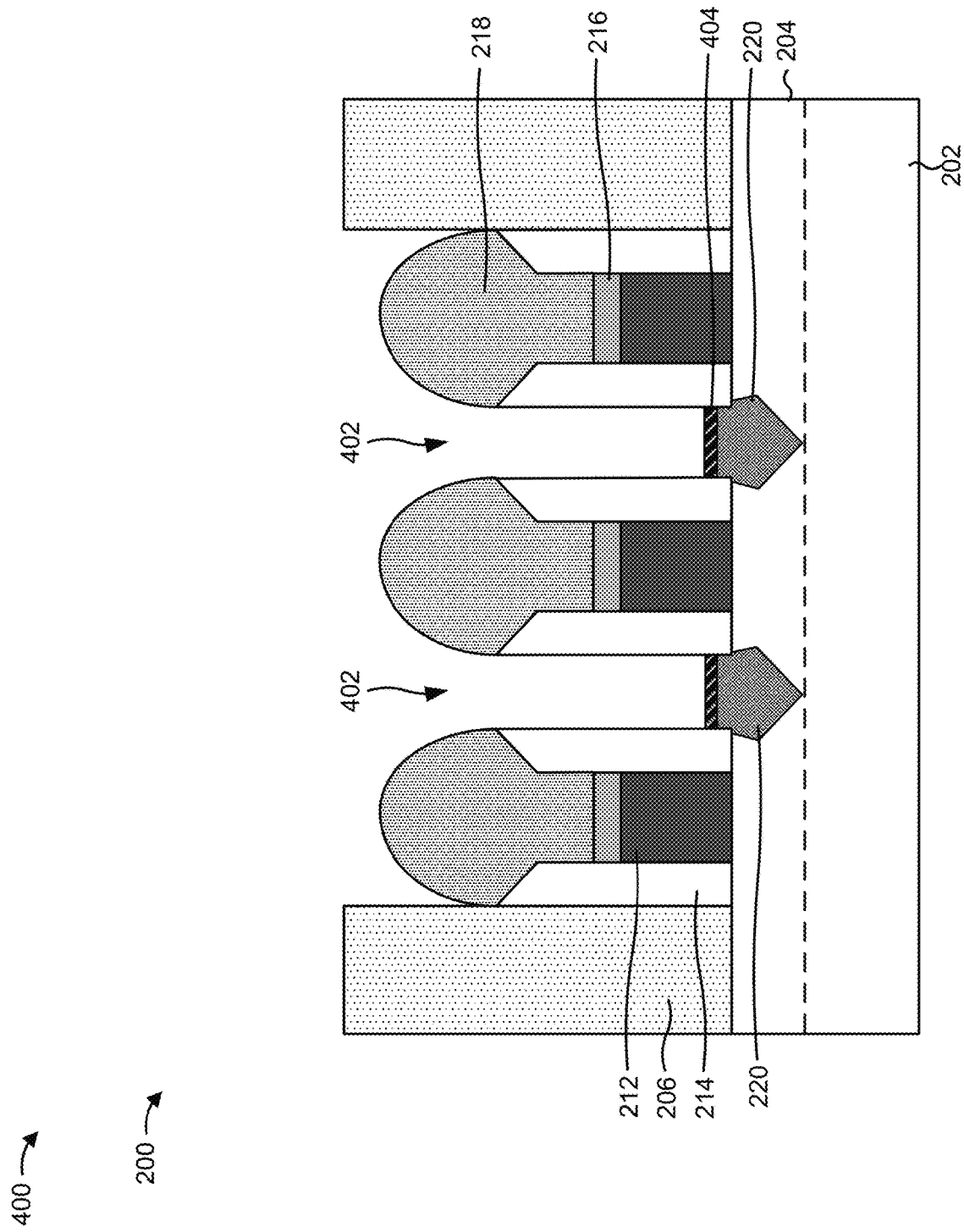

As shown in FIG. 4C, native oxides 404 may form on the top surfaces of the source/drain regions 220 after the openings 402 are formed over the source/drain regions 220. The native oxides 404 may form during a queue time of the semiconductor device 200 as the semiconductor device 200 awaits further processing. For example, the semiconductor device 200 may be exposed to oxygen in the environment in which the semiconductor device 200 is located. The oxygen may react with the top surfaces of the source/drain regions 220 to form the native oxides 404. The native oxides 404 may include an oxide of the material of the source/drain regions 220, such as a silicon oxide ($SiO_x$) if the source/drain regions 220 include silicon or a silicon-containing material.

Figure 4D:
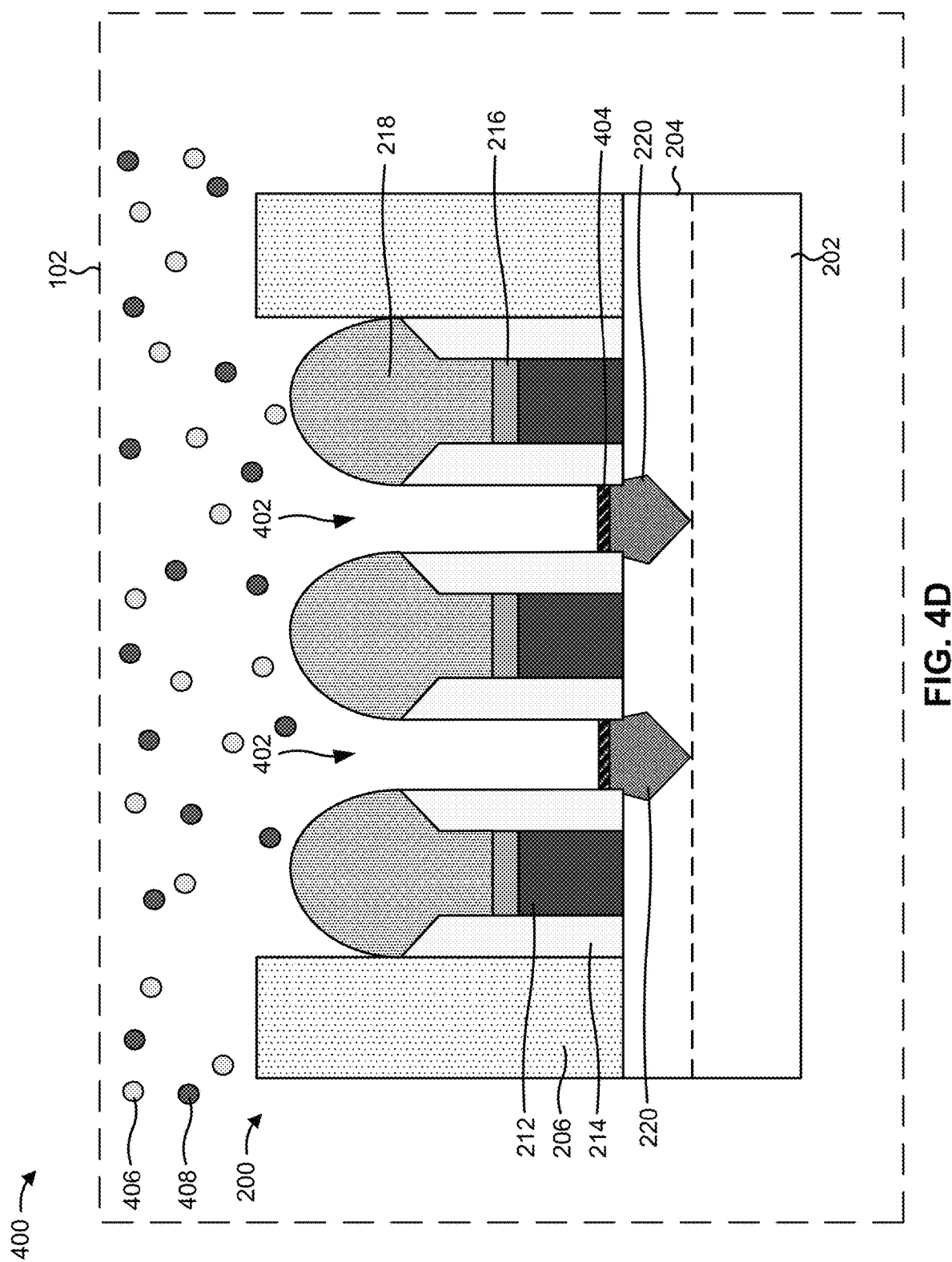
Figure 4E:
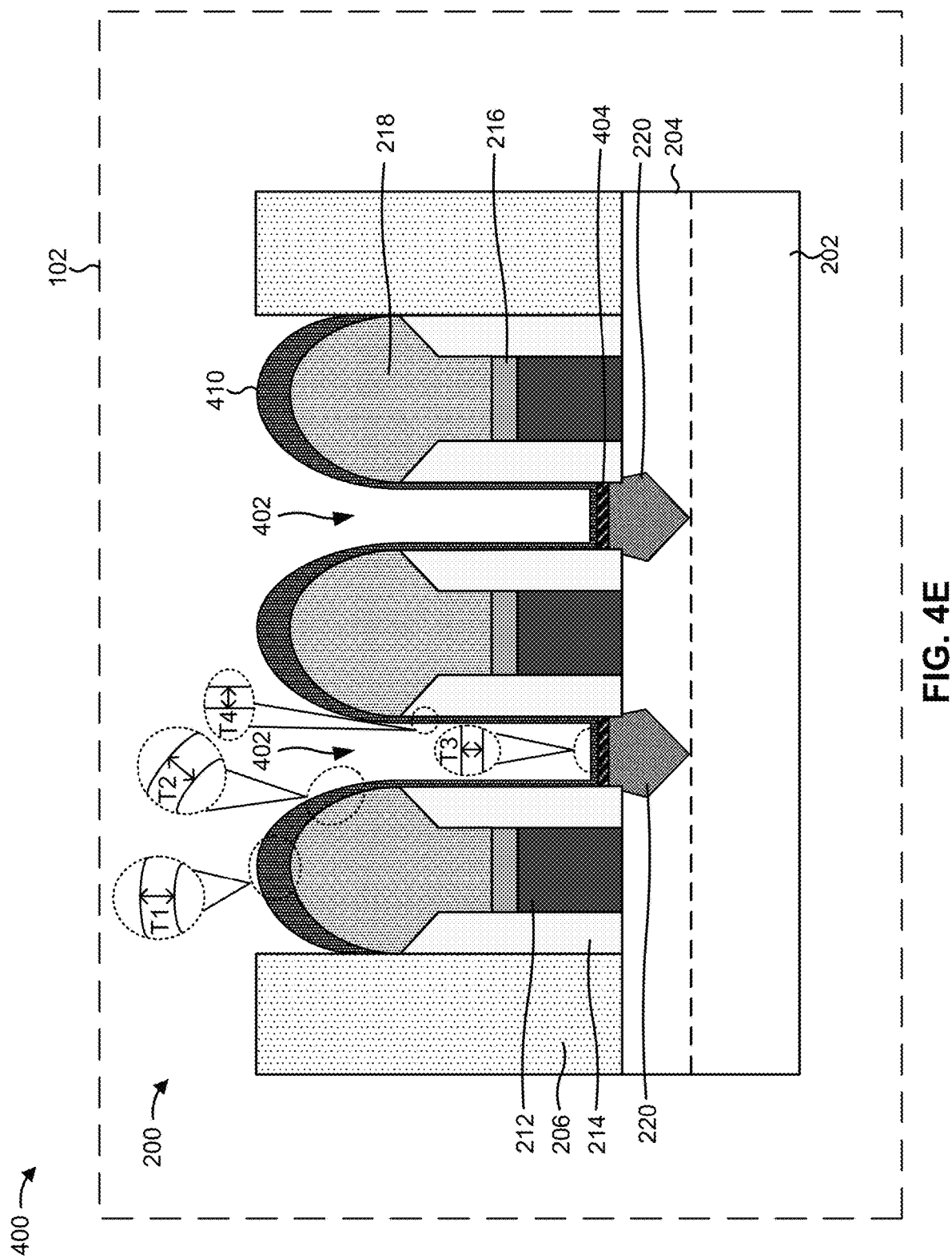

As shown in FIGS. 4D and 4E, a protection layer 410 may be formed over one or more structures of the semiconductor device 200 in preparation for a pre-clean operation to remove the native oxides 404 from the top surfaces of the source/drain regions 220. The protection layer 410 may be formed to protect the dielectric capping layers 218 (and/or other structures of the semiconductor device 200) during a pre-clean operation to remove the native oxides 404 from the top surfaces of the source/drain regions 220.

The protection layer 410 may include a silicon-containing material or a material that includes one or more of the same elements of the material of the source/drain regions 220. For example, if the source/drain regions 220 include silicon (Si), the protection layer 410 may be formed to include silicon. Examples of materials that may be used for the protection layer 410 include silicon oxide ($SiO_x$), silicon (Si), silicon carbide (SiC), and/or silicon nitride ($Si_xN_y$), among other examples. Forming the protection layer 410 of the same material as the source/drain regions 220 (or of the same element-containing material as the source/drain regions 220) enables the same pre-cleaning chemicals to be used to remove the protection layer 410 from the top surfaces of the source/drain regions 220 and to remove the native oxides 404 from the top surfaces of the source/drain regions 220 in the same pre-clean operation. This reduces the complexity of the pre-clean operation and prevents the consumption of additional chemicals in the pre-clean operation.

As shown in FIG. 4D, the semiconductor device 200 may be positioned in a processing chamber of the deposition tool 102. The deposition tool 102 may perform a deposition operation to deposit the protection layer 410. The deposition operation may include a CVD operation, a PVD operation, an ALD operation, and/or another type of deposition operation.

To form the protection layer 410, the deposition tool 102 may cause a reaction between one or more precursor gasses 406 and one or more reactant gasses 408 to form the material of the protection layer 410 on the dielectric capping layers 218, on the sidewall spacers 214, on the top surfaces of the source/drain regions 220, and/or on another layer or structure of the semiconductor device 200. In some implementations, one or more of the precursor gasses 406 and/or the reactant gasses 408 are provided into the processing chamber using a carrier gas. The carrier gas may be a chemically inert gas such as argon (Ar) and/or another chemically inert gas. The deposition tool 102 may provide a flow of the one or more precursor gasses 406 and/or the one or more reactant gasses 408 into the processing chamber at a flow rate that is included in a range of approximately 50 standard cubic centimeters per minute (sccm) to approximately 1,000 sccm. Providing the one or more precursor gasses 406 and/or the one or more reactant gasses 408 at a flow rate in this range enables a sufficient amount of the one or more precursor gasses 406 and/or the one or more reactant gasses 408 to be provided to the processing chamber while enabling accurate control over the concentrations of the one or more precursor gasses 406 and/or the one or more reactant gasses 408. Thus, this range may enable the protection layer 410 to be formed without forming the protection layer 410 too thick (which might cause MD critical dimension shrinkage) or too thin (not sufficient protection provided). However, other values for the range are within the scope of the present disclosure.

Examples of precursor gasses 406 may include silane ($SiH_4$), a silicon chloride ($SiCl_x$ such as $SiCl_4$), a gas containing silicon, hydrogen, and chlorine (e.g., $SiH_xCl_{4-x}$), a silicon iodide ($SiI_x$ such as $SiI_4$), and/or a gas containing silicon, hydrogen, and chlorine (e.g., $SiH_xI_{4-x}$), among other examples. Examples of reactant gasses include methane ($CH_4$), a carbon chloride ($CCl_x$ such as $CCl_4$), chlorine ($Cl_x$ such as $Cl_4$), a gas containing carbon, hydrogen, and chlorine (e.g., $CH_xCL_{4-x}$), a gas containing carbon, hydrogen, and iodine (e.g., $CH_xI_{4-x}$), ammonia ($NH_3$), nitrogen ($N_2$), nitrogen hydride ($N_xH_y$ such as $N_2H_4$), and/or hydrogen ($H_2$), among other examples.

In some implementations, the deposition tool 102 may cause the reaction between the between the one or more precursor gasses 406 and the one or more reactant gasses 408 to form the material of the protection layer 410 by causing a thermal reaction (with or without plasma), a plasma-based reaction, and/or another type of reaction. For example, the deposition tool 102 may perform the deposition operation at a temperature that is included in a range of approximately 20 degrees Celsius to approximately 500 degrees Celsius to form the protection layer 410. Performing the deposition operation in this temperature range may facilitate the reaction between the one or more precursor gasses 406 and the one or more reactant gasses 408 while reducing the likelihood of thermal damage to other structures of the semiconductor device 200. Thus, this range may enable the protection layer 410 to be formed without forming the protection layer 410 too thick (which might cause MD critical dimension shrinkage) or too thin (not sufficient protection provided). However, other values for the range are within the scope of the present disclosure.

As another example, the deposition tool 102 may perform a plasma-based (or plasma-enhanced or plasma-assisted) deposition operation using a plasma to facilitate the reaction between the one or more precursor gasses 406 and the one or more reactant gasses 408. The use of plasma may also enable the deposition tool 102 to control the bombardment and direction of flow of the material in the processing chamber. For example, the deposition tool 102 may perform a plasma-assisted deposition operation using a bias power for the plasma to provide a highly directional (vertical) flow of material in the processing chamber. In some implementations, the bias power is included in a range of approximately 100 watts to approximately 5,000 watts to provide sufficient control of the directionality of the flow of material in the processing chamber while providing a sufficiently low likelihood of plasma damage to the structures of the semiconductor device 200. However, other values for the range are within the scope of the present disclosure.

The deposition tool 102 may use other parameters to control the deposition of the protection layer 410 and/or to achieve a particular or desired profile for the protection layer 410. For example, the deposition tool 102 may control the pressure in the processing chamber to resist the flow of material into the openings 402. This enables the protection layer 410 to be formed to a greater thickness on the dielectric capping layers 218 relative to on the sidewall spacer 214 and on the top surfaces of the source/drain regions in the openings 402. In some implementations, the deposition tool performs the deposition operation at a pressure that is included in a range of approximately 500 millitorr to approximately 30,000 millitorr to provide sufficient resistance to the flow of material into the openings 402 while providing a sufficiently low likelihood of damage to the structures (e.g., structural collapse due to pressure) of the semiconductor device 200. Thus, this range may enable the protection layer 410 to be formed without forming the protection layer 410 too thick (which might cause MD critical dimension shrinkage) or too thin (not sufficient protection provided). However, other values for the range are within the scope of the present disclosure.

As shown in FIG. 4E, the protection layer 410 is formed over and/or on the dielectric capping layers 218 (e.g., over and/or on the top surfaces of the dielectric capping layers 218). The protection layer 410 may also be formed over and/or on the sidewall spacers 214 in the openings 402. The protection layer 410 may also be formed over and/or on the top surfaces of the source/drain regions 220 in the openings 402 (e.g., over and/or on the native oxides 404 that are on the top surfaces). In some implementations, the protection layer 410 is formed as a continuous layer of material that is continuous across the dielectric capping layers 218, the sidewall spacers 214, and the top surfaces of the source/drain regions 220.

As further shown in FIG. 4E, the protection layer 410 may have various thicknesses on the structures of the semiconductor device 200. The deposition of the protection layer 410 is selective in that the protection layer 410 is formed to a greater thickness on the dielectric capping layers 218 than on the sidewall spacers 214 and the top surfaces of the source/drain regions 220. The protection layer 410 may be formed to a thickness (T1) on the dielectric capping layers 218 at or near the center of the dielectric capping layers 218. As another example, the protection layer 410 may be formed to a thickness (T2) on the dielectric capping layers 218 at or near the edges or sides of the dielectric capping layers 218. The thickness (T1) of the protection layer 410 may be greater relative to the thickness (T2) due to the curvature of the top surface of the dielectric capping layers 218. In particular, material of the protection layer 410 may be less likely to adhere to the top surface of the dielectric capping layers 218 as the angle of the top surface increases from the center of the dielectric capping layers 218 toward the edges or sides of the dielectric capping layers 218.

In some implementations, the thickness (T1) on the dielectric capping layers 218 at or near the center of the dielectric capping layers 218 may be included in a range of approximately 15 nanometers to approximately 50 nanometers to provide sufficient protection of the dielectric capping layers 218 during a pre-clean operation to remove the native oxides 404 from the top surfaces of the source/drain regions 220. However, other values for the range are within the scope of the present disclosure.

In some implementations, the thickness (T2) on the dielectric capping layers 218 at or near the edges or sides of the dielectric capping layers 218 may be included in a range of approximately 5 nanometers to approximately 30 nanometers to provide sufficient protection of the dielectric capping layers 218 during a pre-clean operation to remove the native oxides 404 from the top surfaces of the source/drain regions 220 without unduly decreasing the width of the openings 402 (which might otherwise decrease the ability to provide pre-clean chemicals into the openings 402). However, other values for the range are within the scope of the present disclosure. In some implementations, the process temperature and/or the precursor concentrations may be controlled to achieve a greater thickness for the thickness (T2) on the dielectric capping layers 218 at or near the edges or sides of the dielectric capping layers 218 relative to the thickness for the thickness (T1) on the dielectric capping layers 218 at or near the center of the dielectric capping layers 218.

As another example, the protection layer 410 may be formed to a thickness (T3) on the top surfaces of the source/drain regions 220 in the openings 402. In some implementations, the thickness (T3) on the top surfaces of the source/drain regions 220 may be included in a range of approximately 30 nanometers to approximately 150 nanometers to enable the protection layer 410 to be formed to a sufficient thickness on the dielectric capping layers 218 while enabling the protection layer 410 to be fully removed from the top surfaces of the source/drain regions 220 during a pre-clean operation. Accordingly, this range may enable the protection layer 410 to protect the dielectric capping layers 218 during the pre-clean operation while enabling the native oxides 404 on the top surfaces of the source/drain regions 220 to be exposed and removed during the pre-clean operation. However, other values for the range are within the scope of the present disclosure.

In some implementations, a ratio of the thickness (T1) on the dielectric capping layers 218 at or near the center of the dielectric capping layers 218 to the thickness (T3) on the top surfaces of the source/drain regions 220 may be included in a range of approximately 1.3:1 to approximately 3:1 to enable the protection layer 410 to be formed to a sufficient thickness on the dielectric capping layers 218 while enabling the protection layer 410 to be fully removed from the top surfaces of the source/drain regions 220 during a pre-clean operation. Accordingly, this range may enable the protection layer 410 to protect the dielectric capping layers 218 during the pre-clean operation while enabling the native oxides 404 on the top surfaces of the source/drain regions 220 to be exposed and removed during the pre-clean operation. However, other values for the range are within the scope of the present disclosure.

The thickness (T1) on the dielectric capping layers 218 at or near the center of the dielectric capping layers 218, and the thickness (T2) on the dielectric capping layers 218 at or near the edges or sides of the dielectric capping layers 218, may be greater relative to the thickness (T3) on the top surfaces of the source/drain regions 220 such that the protection layer 410 is fully removed from the top surfaces of the source/drain regions 220 during a pre-clean operation while the protection layer 410 still remains on the dielectric capping layers 218 during (and/or after) the pre-clean operation. This ensures that no residual portions of the protection layer 410 remain on the top surfaces of the source/drain regions 220, which might otherwise reduce the effectiveness of the pre-clean operation to remove the native oxides 404. Residual native oxides 404 and/or residual material of the protection layer 410 on the top surfaces of the source/drain regions 220 may result in increased contact resistance between the source/drain regions 220 and the source/drain contacts 222 that are to be formed over the source/drain regions 220 in the openings 402.

As another example, the protection layer 410 may be formed to a thickness (T4) on the sidewall spacers 214 in the openings 402. In some implementations, the thickness (T4) on the sidewall spacers 214 may be included in a range of approximately 8 nanometers to approximately 20 nanometers to provide sufficient protection of the sidewall spacers 214 during a pre-clean operation to remove the native oxides 404 from the top surfaces of the source/drain regions 220 without unduly decreasing the width of the openings 402 (which might otherwise decrease the ability to provide pre-clean chemicals into the openings 402). However, other values for the range are within the scope of the present disclosure. The thickness (T1) on the dielectric capping layers 218 at or near the center of the dielectric capping layers 218, and the thickness (T2) on the dielectric capping layers 218 at or near the edges or sides of the dielectric capping layers 218, may be greater relative to the thickness (T4) on the sidewall spacers 214 such that the protection layer 410 is fully removed from the sidewall spacers 214 during a pre-clean operation while the protection layer 410 still remains on the dielectric capping layers 218 during (and/or after) the pre-clean operation. This ensures that no residual portions of the protection layer 410 remain on the sidewall spacers 214, which might otherwise decrease the width of the openings 402 and, thus, the width of the source/drain contacts 222 that are to be formed in the openings 402.

Figure 4F:
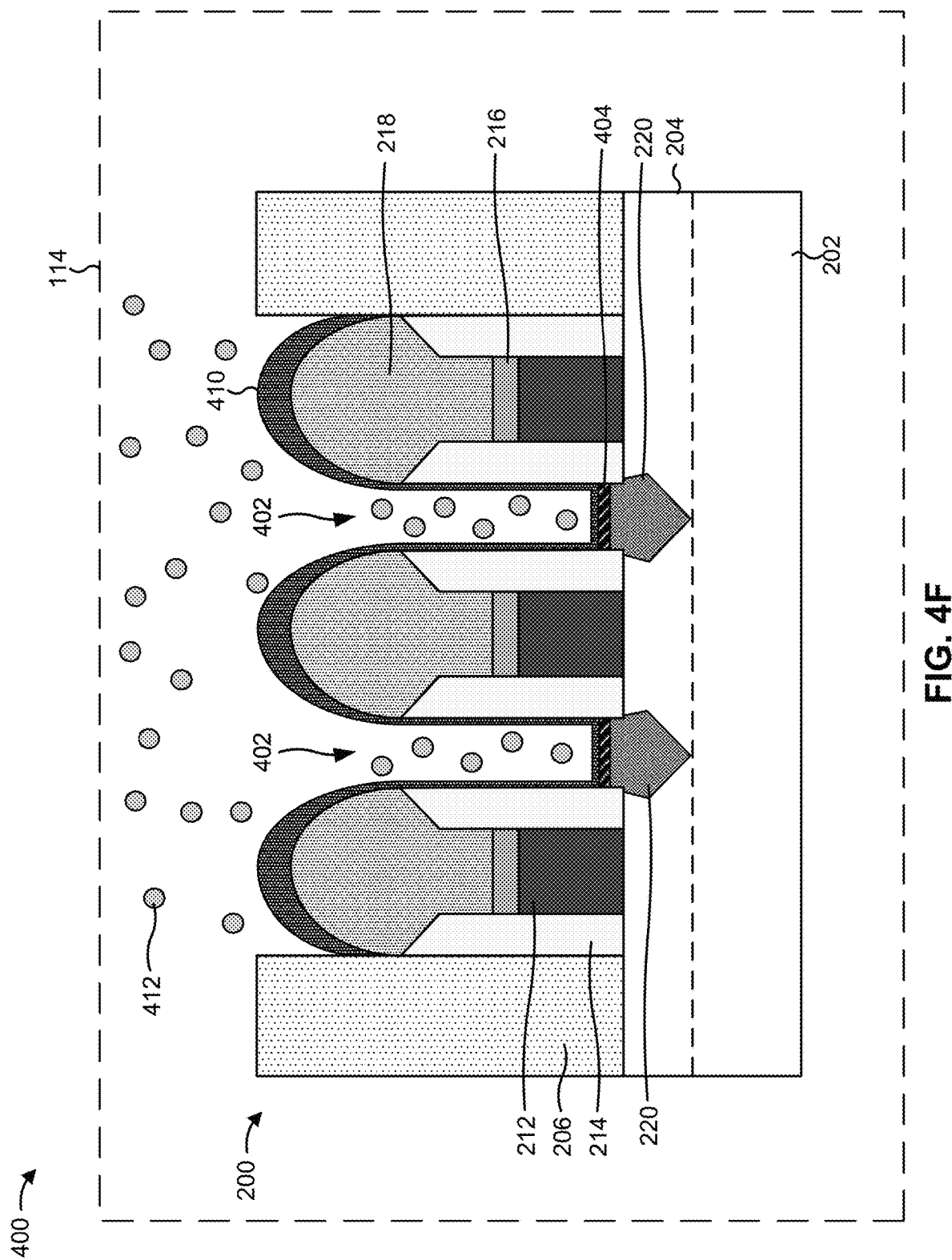

As shown in FIG. 4F, the semiconductor device 200 may be placed in a processing chamber of the pre-clean tool 114 so that a pre-clean operation can be performed to remove the native oxides 404 from the top surfaces of the source/drain regions 220. In some implementations, the pre-clean operation is performed to remove the native oxides 404 and/or other contaminants from other surfaces of the semiconductor device 200.

As further shown in FIG. 4F, the pre-clean operation may include flowing in one or more pre-cleaning chemicals 412 into the processing chamber of the pre-clean tool 114. The pre-cleaning chemical(s) 412 may be formed from one or more chemical gasses, such as an ammonia ($NH_3$) gas, a nitrogen fluoride gas (e.g., nitrogen trifluoride ($NF_3$) gas), and/or another type of gas. In some implementations, the one or more chemical gasses are provided into the processing chamber at the same time or sequentially. Once the flow-in of the chemical gasses is complete, the pressure in the processing chamber may be stabilized.

In some implementations, a plasma source of the pre-clean tool 114 is used to cause a reaction between chemical gasses in the processing chamber to form the pre-cleaning chemical(s) 412. The plasma source may include an inductively coupled plasma (ICP) source, a capacitively coupled plasma (CCP) source, and/or another type of plasma source capable of generating a plasma. The plasma source may ignite the plasma, which may cause the reaction between the chemical gasses in the processing chamber to form the pre-cleaning chemical(s) 412. In some implementations, the plasma source may ignite the plasma such that the plasma source causes the reaction between the chemical gasses during flow-in of the chemical gasses into the processing chamber.

The pre-cleaning chemical(s) 412 may include a hydrogen fluoride (HF) gas and/or another pre-cleaning chemical that is capable of etching silicon-containing materials. In this way, the pre-cleaning chemical(s) 412 may be used to etch both the protection layer 410 and the top surfaces of the source/drain regions 220 (e.g., to remove the native oxides 404 from the top surfaces of the source/drain regions 220) during the pre-clean operation.

Figure 4G:
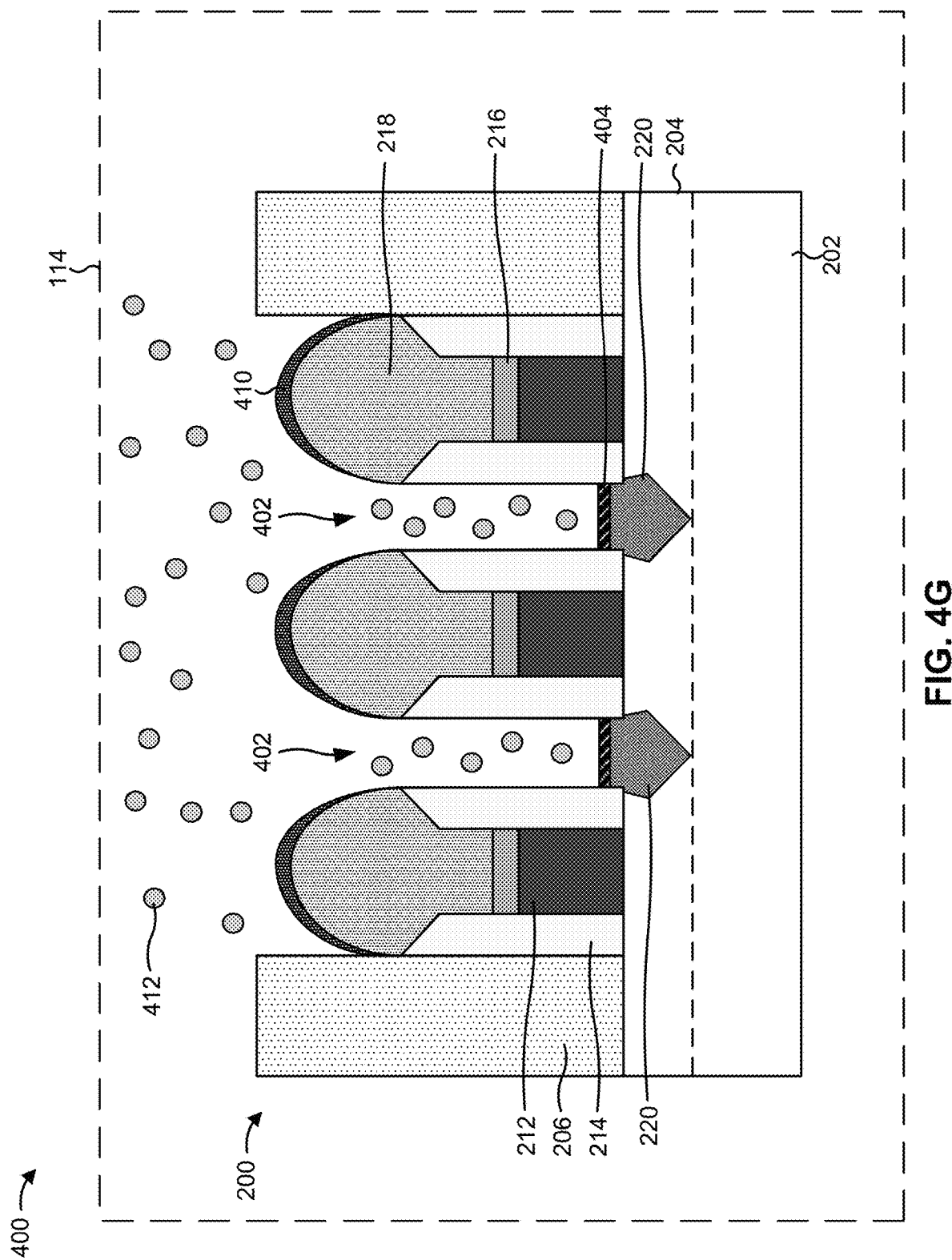

As shown in FIG. 4G, the pre-cleaning chemical(s) 412 flows into the openings 402 between the metal gate structures 212 to etch the protection layer 410, and to remove the protection layer 410 from the sidewall spacers 214 and from the top surfaces of the source/drain regions 220 during the pre-cleaning operation. This exposes the top surfaces of the source/drain region 220 (and exposes the native oxides 404 on the top surfaces), which enables the pre-cleaning chemical(s) 412 to etch the top surfaces of the source/drain region 220 to remove the native oxides 404 from the top surfaces of the source/drain regions 220.

As further shown in FIG. 4G, the protection layer 410 on the dielectric capping layers 218 is also etched by the pre-cleaning chemical(s) 412. The thickness of the protection layer 410 on the dielectric capping layers 218 is reduced, but the protection layer 410 is not fully removed from the dielectric capping layers 218. This enables the protection layer 410 to continue to protect the dielectric capping layers 218 from being etched by the pre-cleaning chemical(s) 412 during the pre-clean operation. In this way, the protection layer 410 reduces, minimizes, and/or prevents the occurrence of chopping or clipping of the dielectric capping layers 218 during the pre-cleaning operation.

Figure 4H:
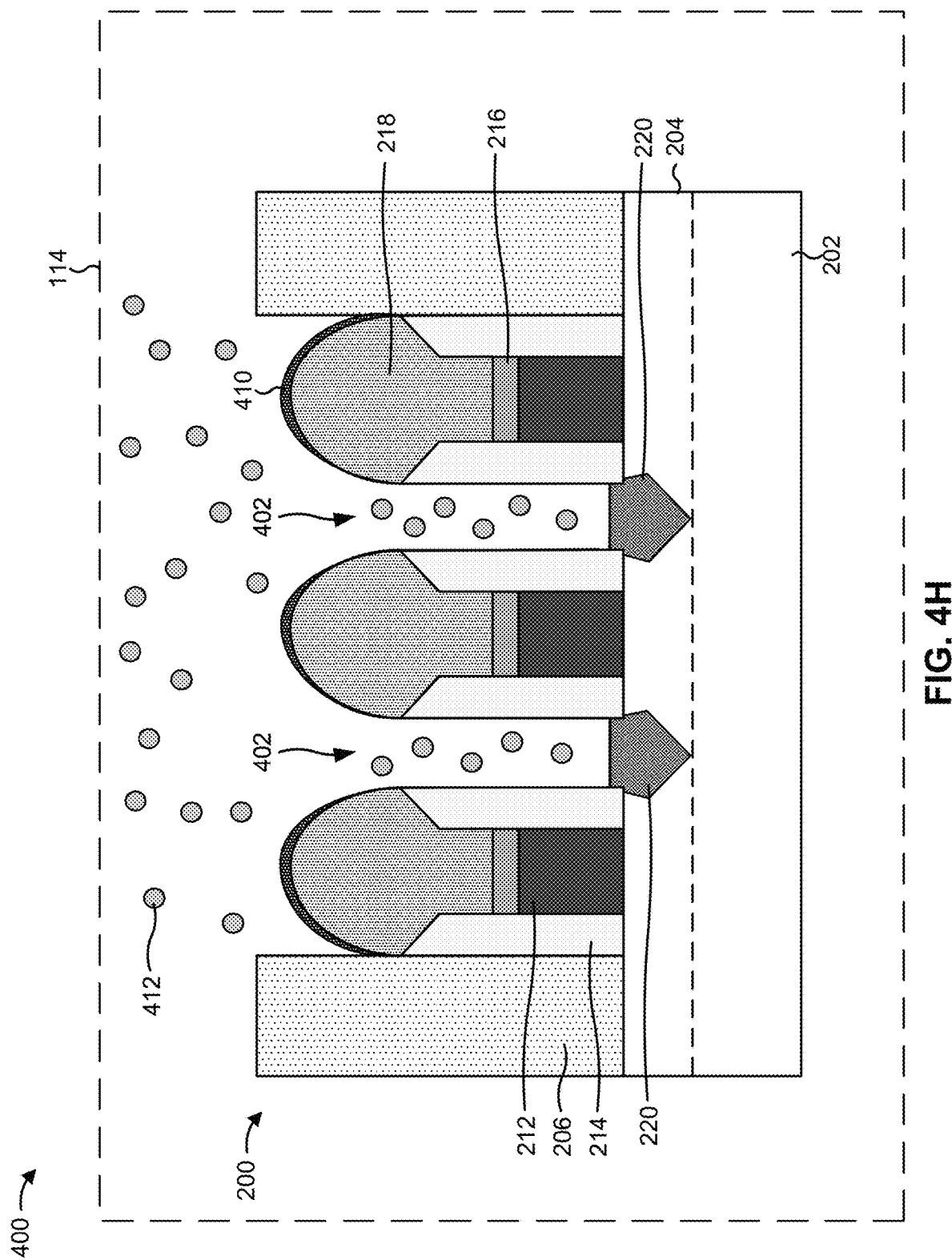

As shown in FIG. 4H, the pre-cleaning chemical(s) 412 may etch the top surfaces of the source/drain regions 220 to remove the native oxides from the top surfaces of the source/drain regions 220. In this way, the top surfaces of the source/drain regions 220 are cleaned in preparation for forming the metal silicide layer 228 on the top surfaces of the source/drain regions 220. Since the deposited protection layer 410 on top of the dielectric capping layers 218 may be thicker than the deposited protection layer 410 on the source/drain regions 220 and the deposited protection layer 410 on sidewalls of the openings 402, the protection layer 410 may remain on top of the dielectric capping layers 218 after the pre-cleaning process.

As indicated above, FIGS. 4A-4H are provided as an example. Other examples may differ from what is described with regard to FIGS. 4A-4H.

FIGS. 5A-5D are diagrams of an example implementation 500 described herein. The example implementation 500 includes an example of forming the source/drain contacts 222 of the semiconductor device 200 illustrated in FIG. 2 and/or elsewhere herein.

Figure 5A:
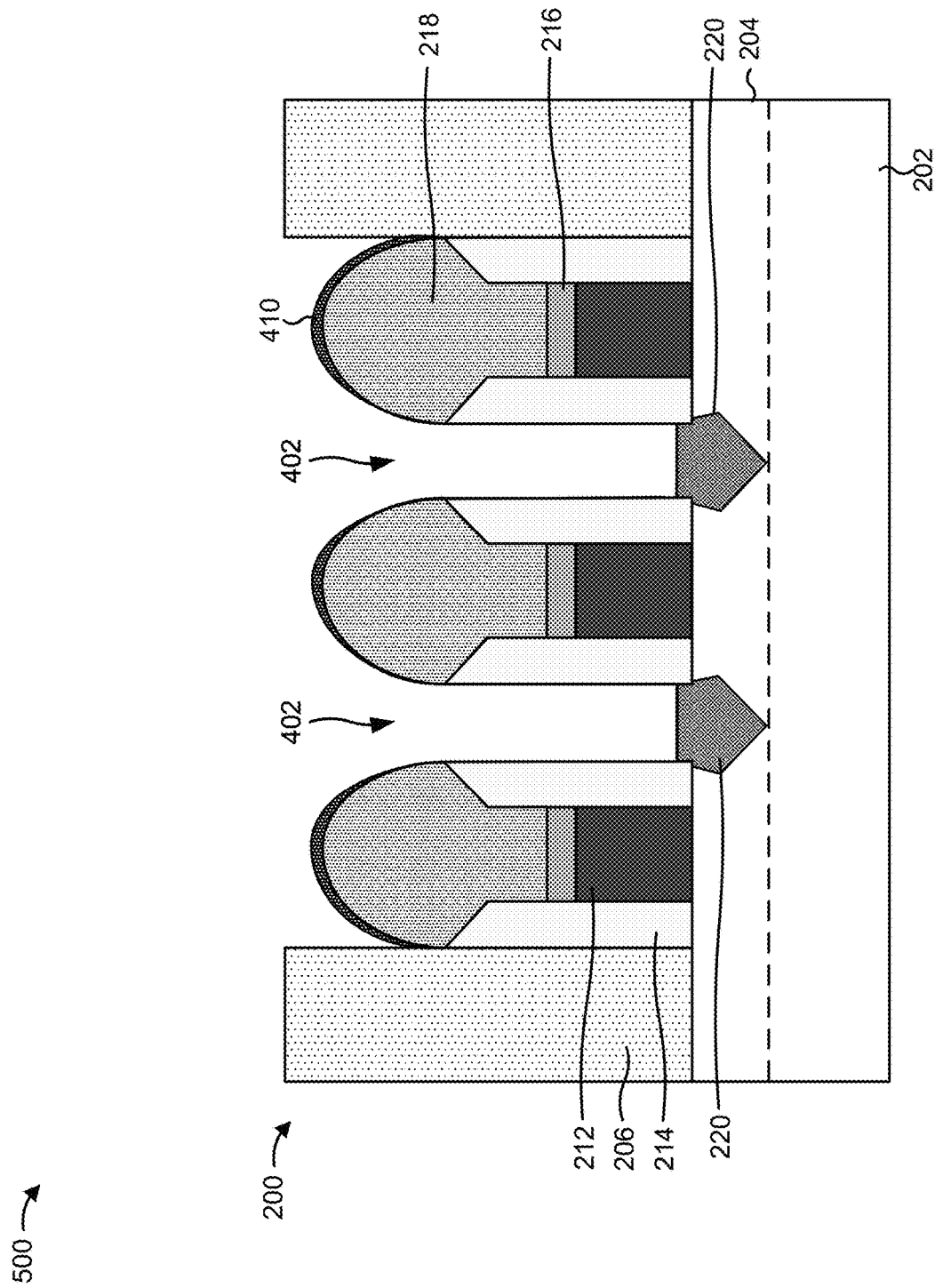

As shown in FIG. 5A, one or more of the semiconductor processing operations described in connection with the example implementation 500 may be performed after the semiconductor processing operations described in connection with FIGS. 4A-4H. As further shown in FIG. 5A, portions of the protection layer 410 may remain on the dielectric capping layers 218 after the pre-clean operation described above in connection with the example implementation 400. However, the protection layer 410 is no longer on the sidewall spacers 214 and the top surfaces of the source/drain regions 220 (along with the native oxides 404) after the pre-clean operation described above in connection with the example implementation 400.

Figure 5B:
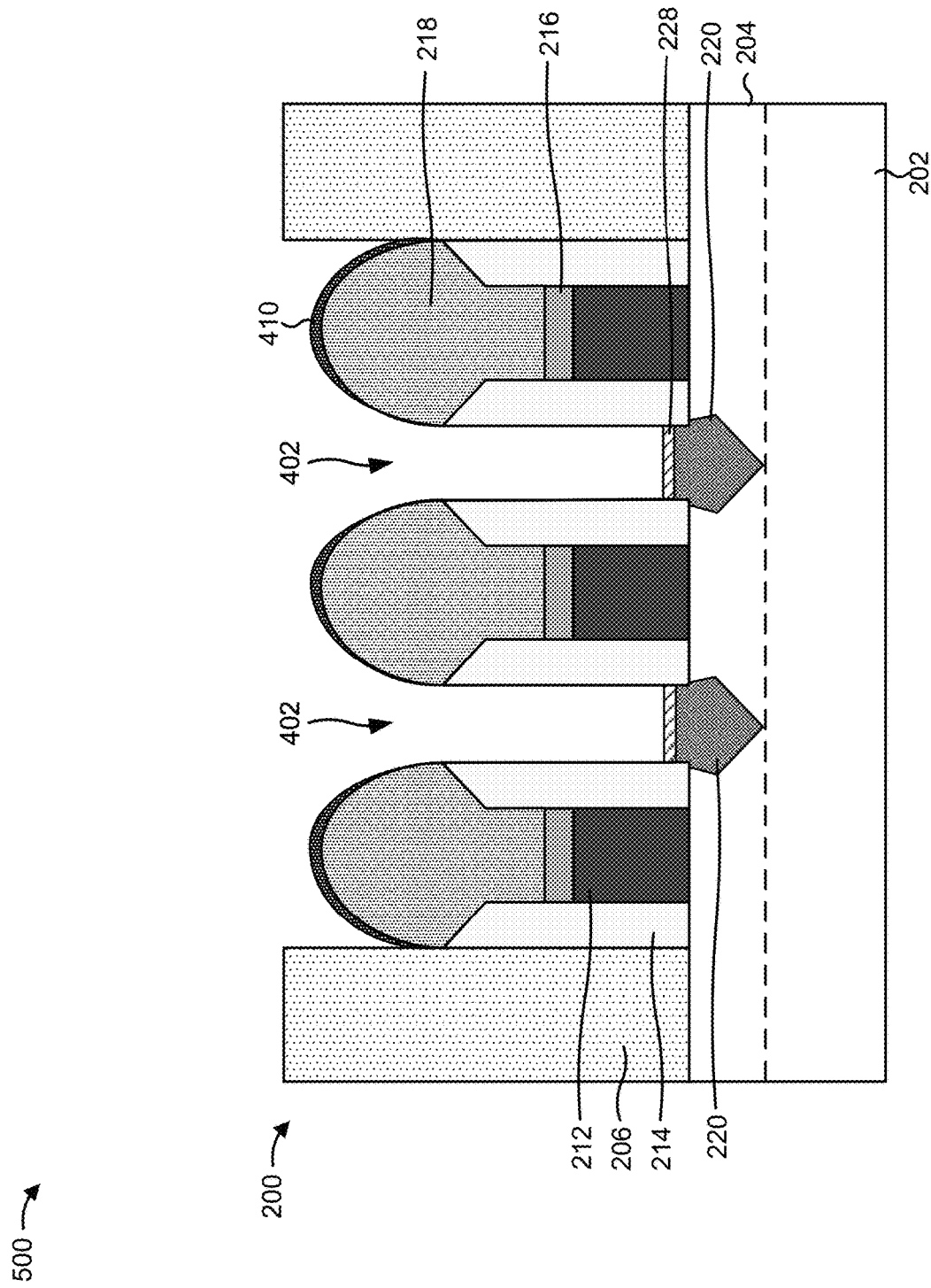

As shown in FIG. 5B, the metal silicide layer 228 may be formed on the top surfaces of the source/drain regions 220 (e.g., after the pre-clean operation). To form the metal silicide layer 228, the deposition tool 102 and/or the plating tool 112 may deposit a metal layer on the top surfaces of the source/drain regions 220. The deposition tool 102 may use a CVD technique, an ALD technique, a PVD technique, and/or another deposition technique to deposit the metal layer, and/or the plating tool 112 may use an electroplating technique and/or another type of plating technique to deposit the metal layer. The metal layer may include a metallic material, such as titanium (Ti), nickel (Ni), and/or another type of metal.

An anneal operation (e.g., a rapid thermal anneal (RTA) operation or another type of anneal operation) may be performed such that the temperature of the metal layer is increased. The increased temperature of the metal layer causes the metal layer to react with the silicon of the source/drain region 220. The reaction causes the metal layer and the silicon in the source/drain region 220 to form the metal silicide layer 228 on the top surfaces of the source/drain regions 220. The metal silicide layer may include a metal silicide, such as a titanium silicide ($TiSi_x$), a nickel silicide ($Ni_xSi$), or another metal silicide, that is to reduce contact resistance between the source/drain regions 220 and the source/drain contacts 222 that are to be formed over the source/drain regions 220.

Figure 5C:
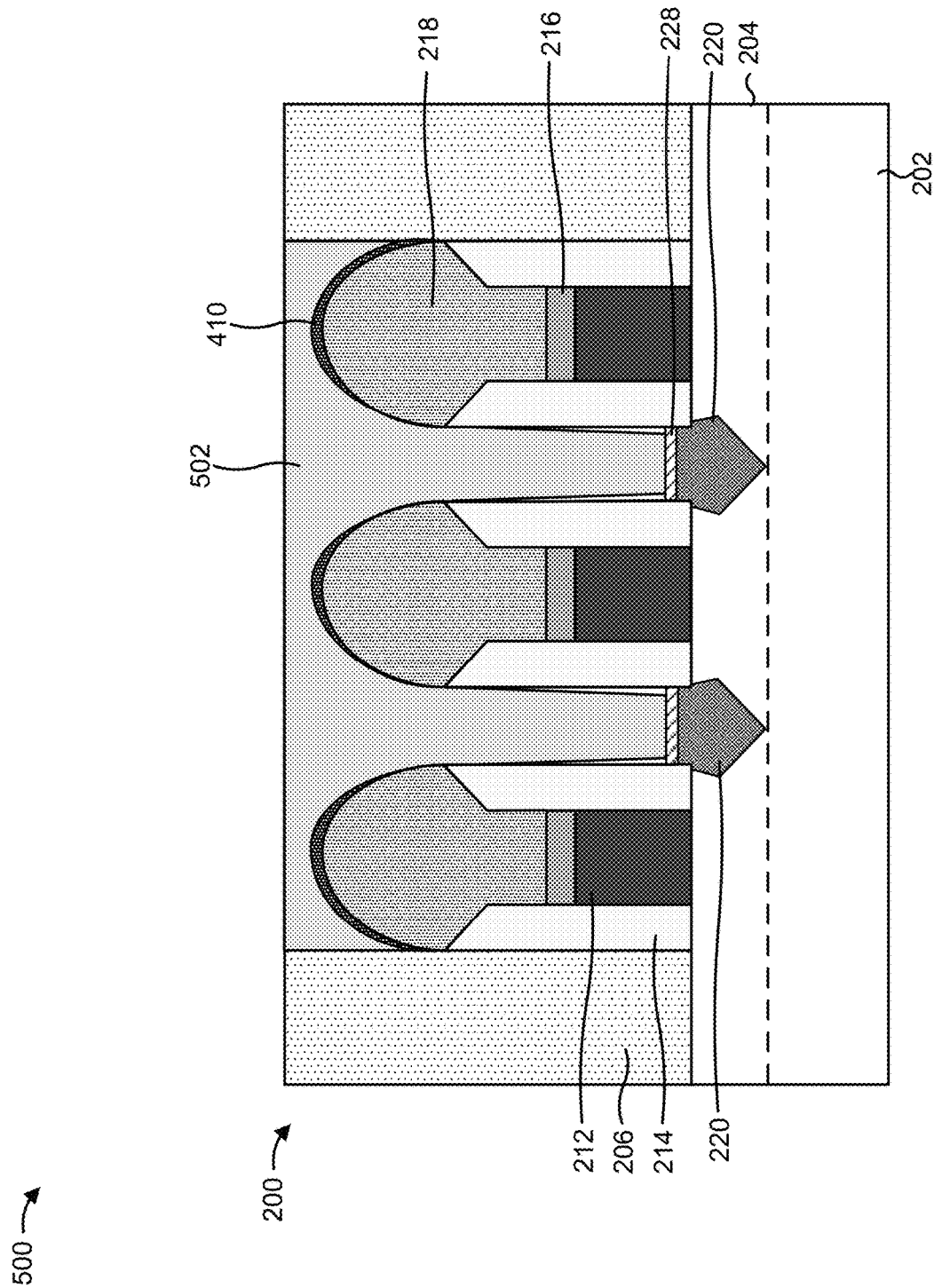

As shown in FIG. 5C, a conductive material 502 is deposited in the openings 402 over and/or on the metal silicide layer 228. The deposition tool 102 may use a CVD technique, an ALD technique, a PVD technique, and/or another deposition technique to deposit the conductive material 502, and/or the plating tool 112 may use an electroplating technique and/or another type of plating technique to deposit the conductive material 502.

As further shown in FIG. 5C, the conductive material 502 may be deposited such that the openings 402 are overfilled, and such that the conductive material 502 is deposited at least partially over the dielectric capping layers 218 (and thus, the protection layer 410 on the dielectric capping layers 218). This ensures that the openings 402 are fully filled with the conductive material 502 to reduce the likelihood of formation of gaps or voids in the source/drain contacts 222 that are formed from the conductive material 502. In some implementations, an anneal operation may be performed to reflow the conductive material 502 to eliminate gaps and/or voids in the conductive material 502.

Figure 5D:
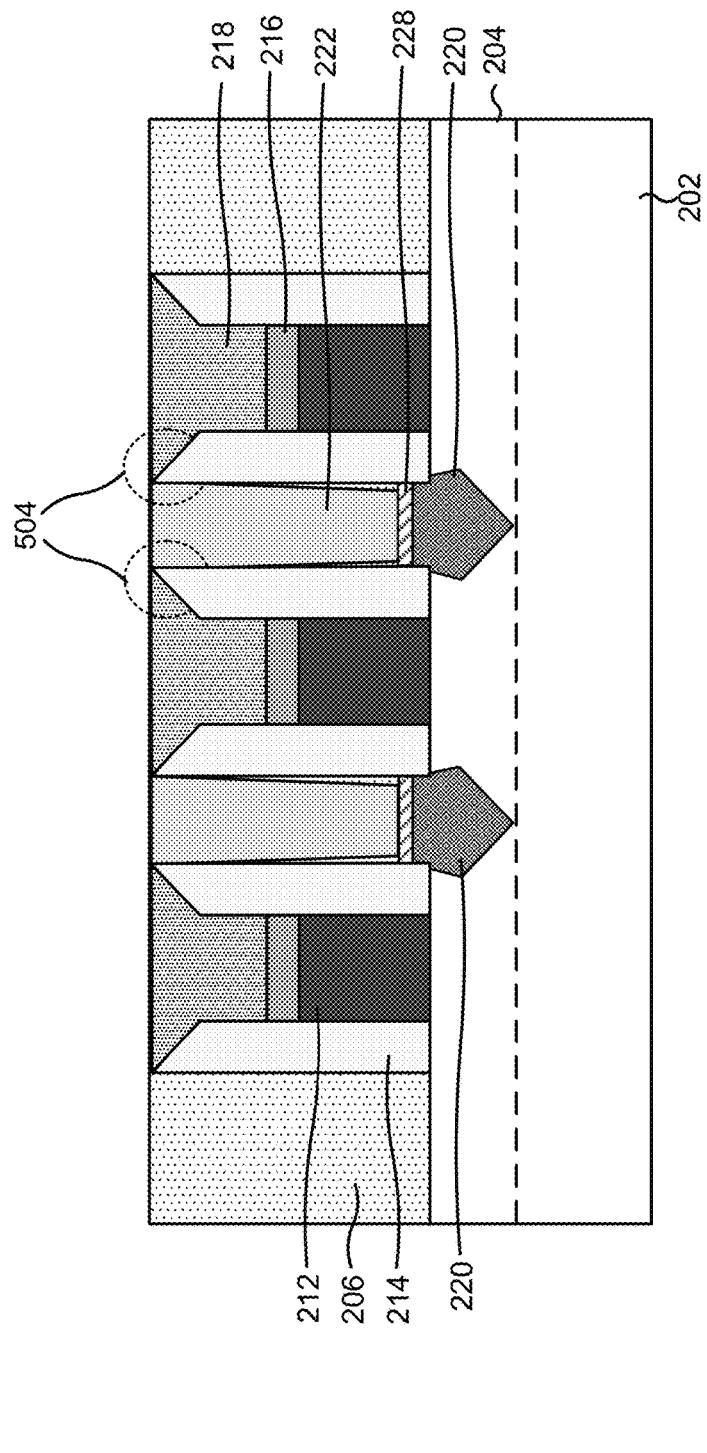

As shown in FIG. 5D, the semiconductor device 200 may be planarized. The planarization tool 110 may perform a planarization operation, which may include a CMP operation and/or another type of planarization operation. In the planarization operation, portions of the dielectric capping layers 218 are removed. Moreover, the protection layer 410 on the dielectric capping layers 218 are removed such that the protection layer 410 is not present in the final structure of the semiconductor device 200. Portions of the conductive material 502 are also removed during the planarization operation, thereby forming the source/drain contacts 222 over the metal silicide layer 228 and over the source/drain regions 220.

As further shown in FIG. 5D, edge regions 504 of the dielectric capping layers 218 are intact and not chopped or clipped. This is due to the use of the protection layer 410 during the pre-clean operation described above to remove the native oxides 404 from the top surfaces of the source/drain regions 220. Accordingly, the absence of chopping or clipping in the edge regions 504 enables the dielectric capping layers 218 to provide effective electrical isolation.

As indicated above, FIGS. 5A-5D are provided as an example. Other examples may differ from what is described with regard to FIGS. 5A-5D.

Figure 6A:
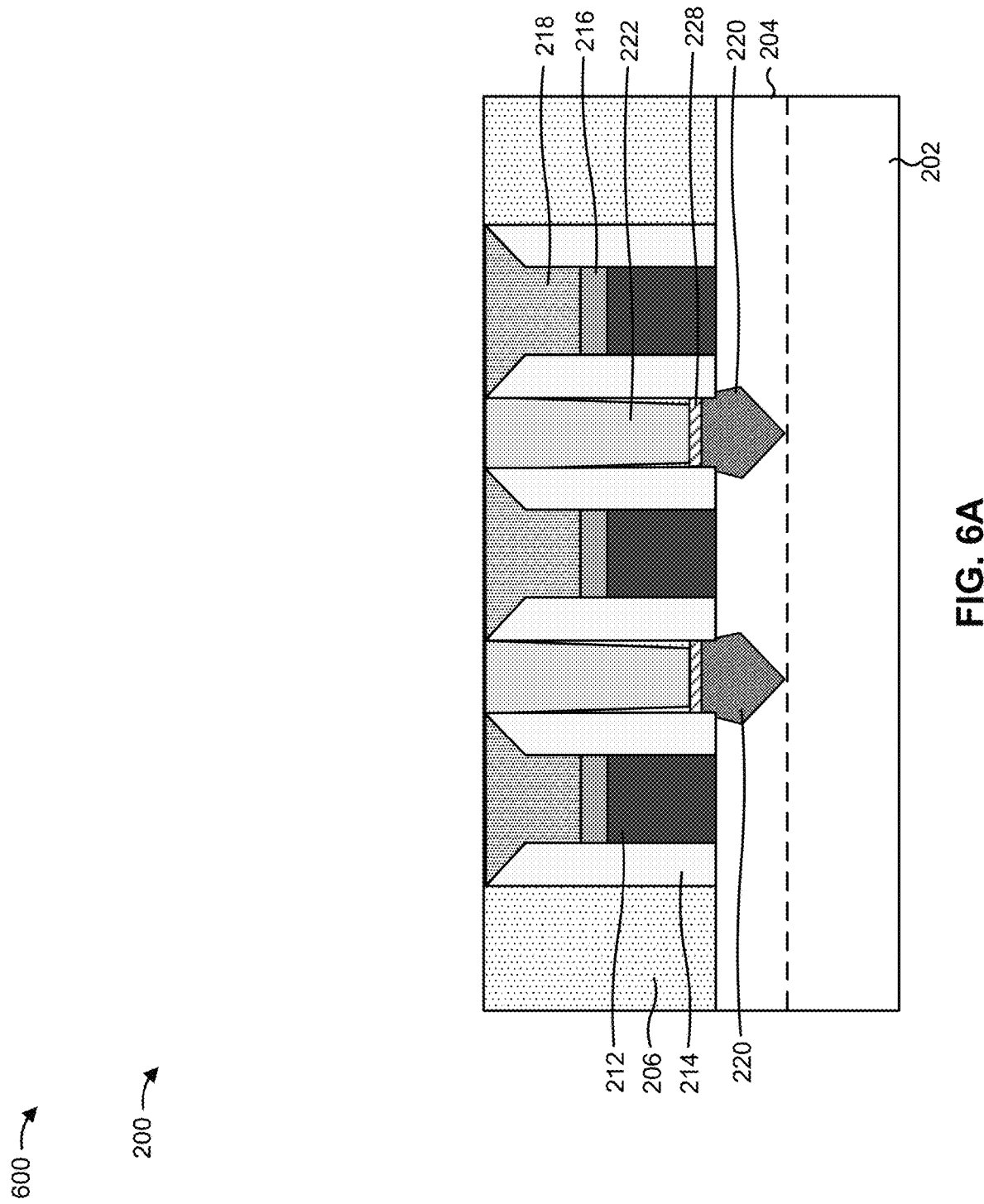

FIGS. 6A-6F are diagrams of an example implementation 600 described herein. The example implementation 600 includes an example of forming the gate interconnect structure 224 and the source/drain interconnect structure 226 illustrated in FIG. 2 and/or elsewhere herein. As shown in FIG. 6A, one or more of the semiconductor processing operations described in connection with the example implementation 600 may be performed after the semiconductor processing operations described in connection with FIGS. 4A-4H and/or FIGS. 5A-5D.

Figure 6B:
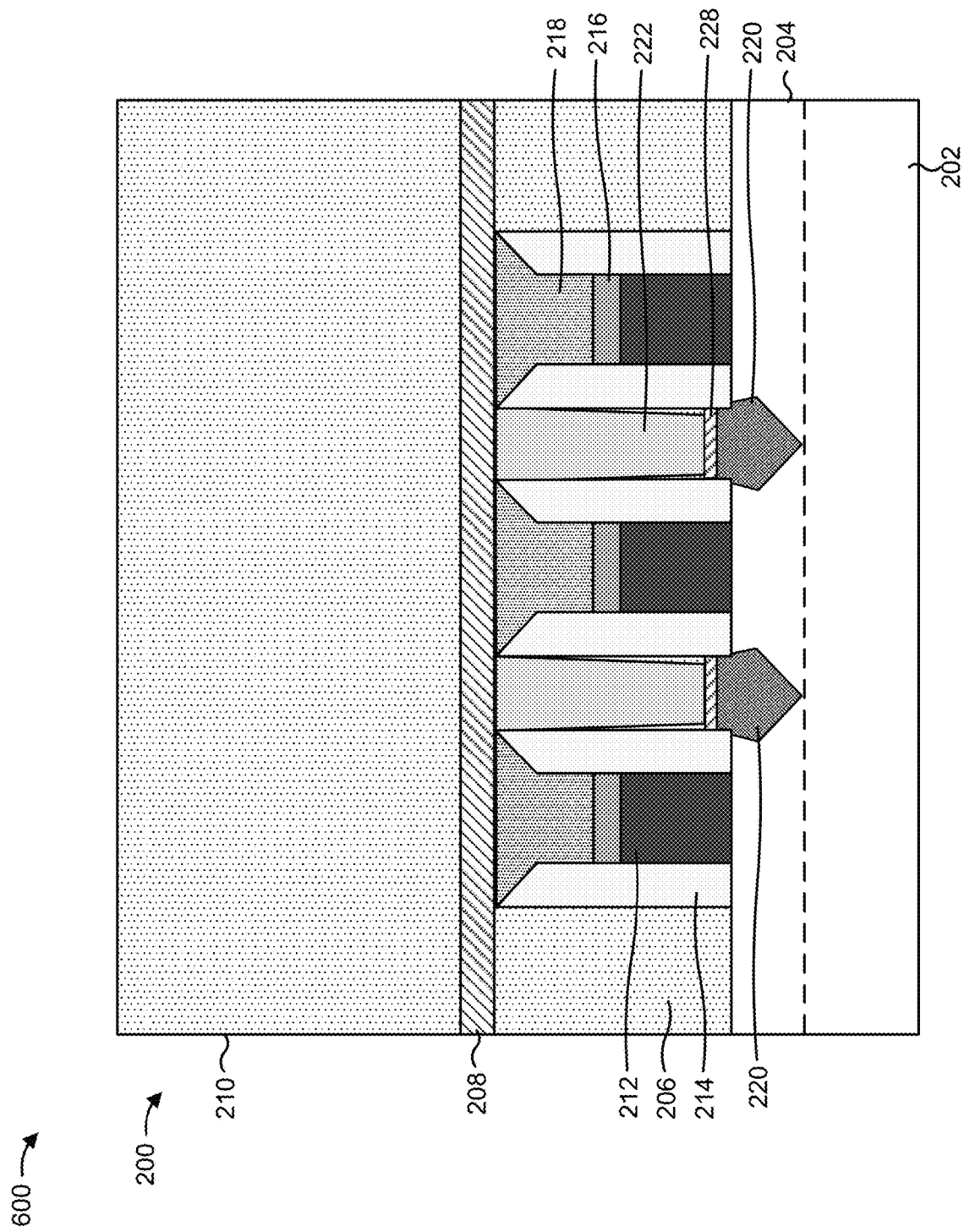

As shown in FIG. 6B, the ESL 208 is formed on the semiconductor device 200, and the dielectric layer 210 is formed over and/or on the ESL 208. In some implementations, a deposition tool 102 deposits the ESL 208 and the dielectric layer 210 using a CVD, ALD, PVD, and/or another deposition technique. An example dimension for the ESL 208 includes a thickness. In some implementations, the ESL 208 is formed to a thickness that is included in a range of approximately 10 nanometers to approximately 20 nanometers to provide sufficient etch stop performance, to achieve a particular thickness or height for the gate interconnect structure 224 and/or a particular thickness or height for the source/drain interconnect structure 226, and/or to achieve one or more other parameters. However, other values for the thickness of the ESL 208 are within the scope of the present disclosure. An example dimension for the dielectric layer 210 includes a thickness. In some implementations, the dielectric layer 210 is formed to a thickness that is included in a range of approximately 40 nanometers to approximately 60 nanometers to provide interlayer isolation, to achieve a particular thickness or height for the gate interconnect structure 224 and/or a particular thickness or height for the source/drain interconnect structure 226, and/or to achieve one or more other parameters. However, other values for the thickness of the dielectric layer 210 are within the scope of the present disclosure.

Figure 6C:
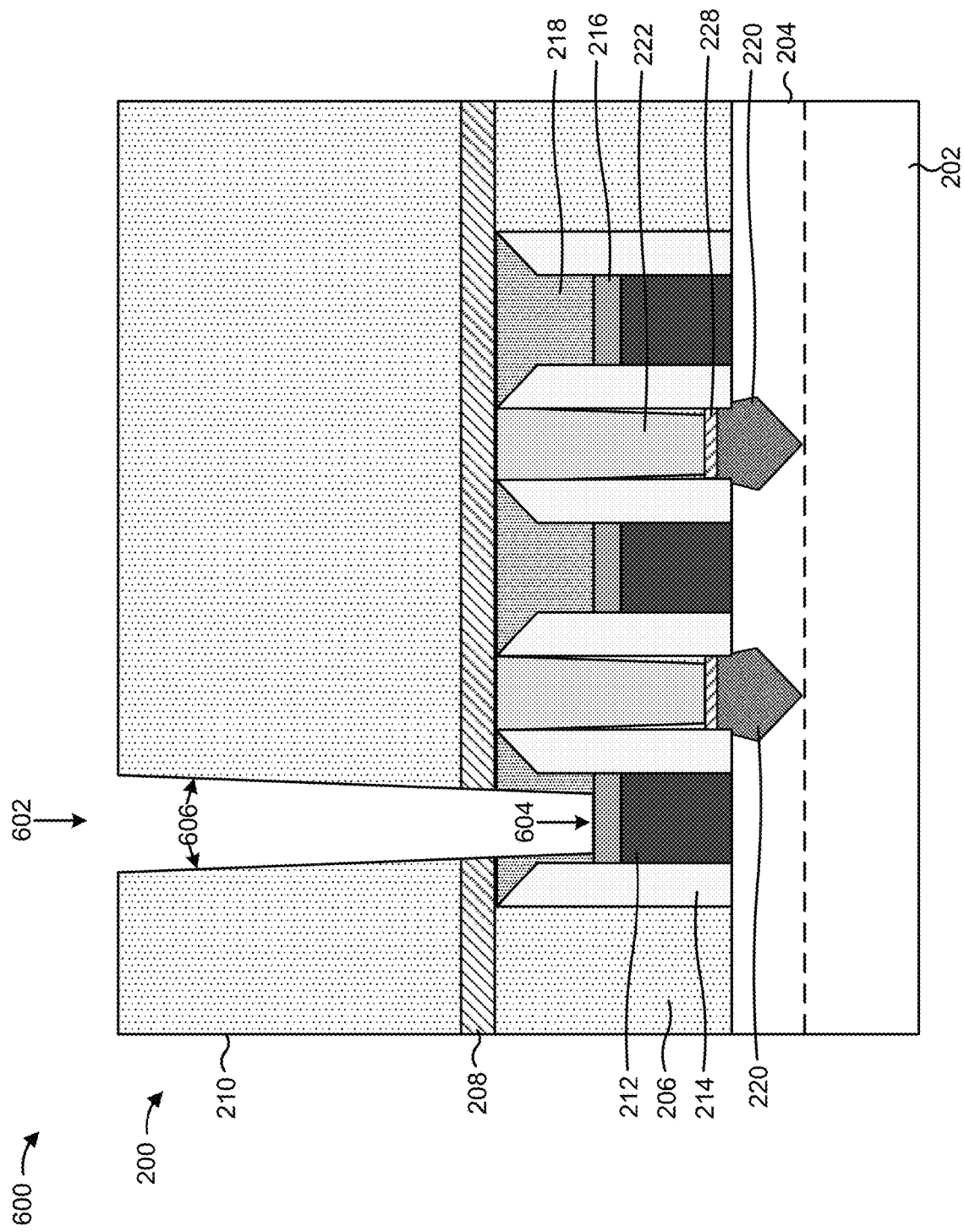

As shown in FIG. 6C, an opening (or a recess) 602 is formed to a metal capping layer 216 that is over a metal gate structure 212. The opening 602 may be formed in and through the dielectric layer 210, in and through the ESL 208, and/or in and through a dielectric capping layer 218 that is over the metal gate structure 212. The opening 602 includes a bottom 604 and a plurality of sidewalls 606. In some implementations, the etch tool 108 performs the one or more etch operations to form the opening 602.

The one or more etch operations may include one or more dry etch operations (e.g., operation(s) that are performed using dry chemicals or gasses), one or more wet etch operations (e.g., operation(s) that are performed using wet chemicals), and/or one or more etch operations of another etch type. In some implementations, the one or more etch operations may include the use of a plasma (e.g., a plasma-based etch). In some implementations, a pattern in one or more patterning layers is used to etch the dielectric layer 210, the ESL 208, and/or the dielectric capping layer 218 to form the opening 602. In these implementations, the deposition tool 102 forms the one or more patterning layers on the dielectric layer 210. The exposure tool 104 exposes the one or more patterning layers to a radiation source to pattern the photoresist layer. The developer tool 106 develops and removes portions of the one or more patterning layers to expose the pattern. The etch tool 108 etches the dielectric layer 210, the ESL 208, and/or to the dielectric capping layer 218 based on the pattern to form the opening 602.

Figure 6D:
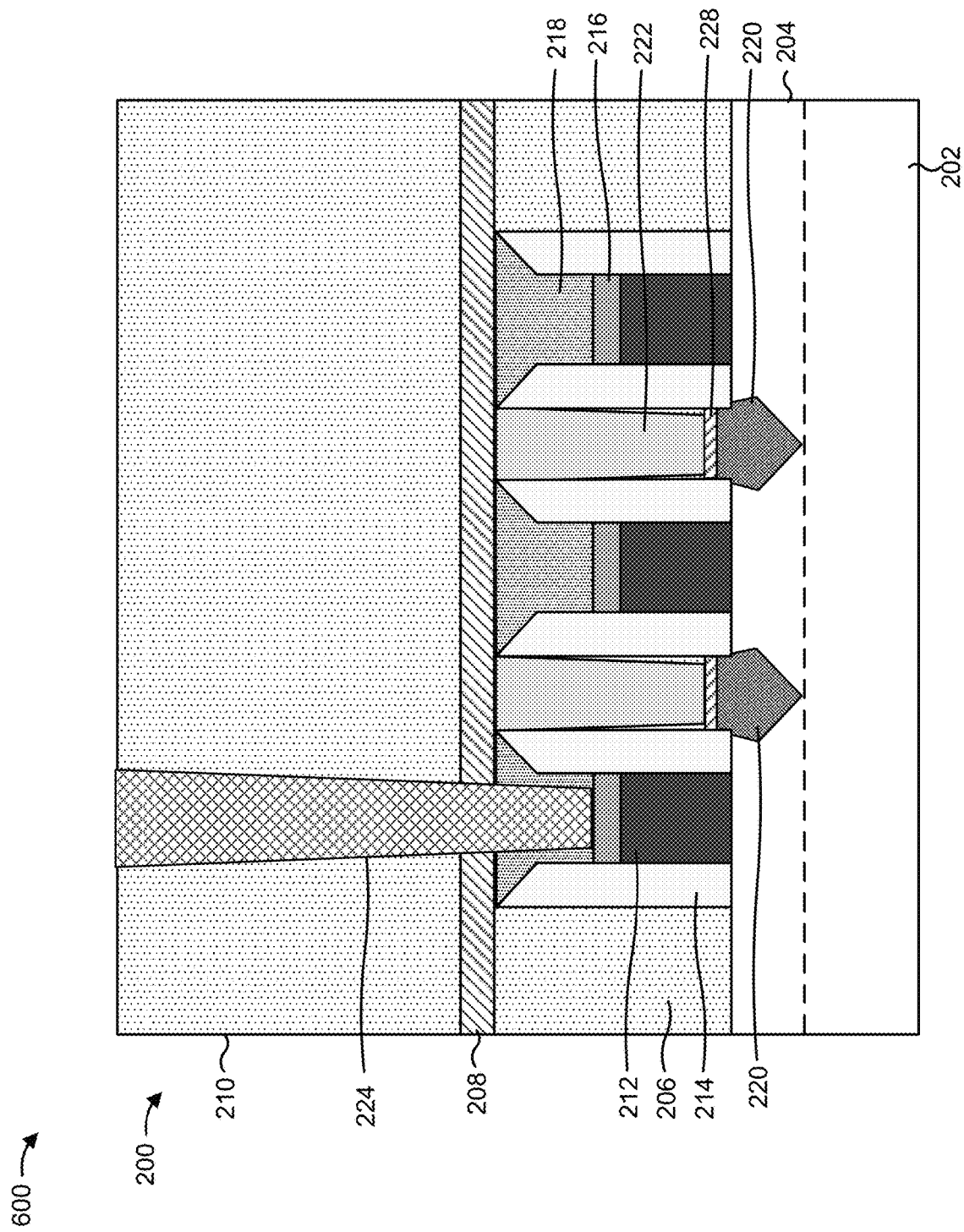

As shown in FIG. 6D, the opening 602 is filled with a conductive material (or a conductive material composition) to form the gate interconnect structure 224 after the second etch operation. In particular, the conductive material is deposited over the conductive structure (e.g., the metal capping layer 216 or the metal gate structure 212) in the opening 602. In some implementations, the deposition tool 102 performs a PVD operation, a CVD operation, or another type of deposition operation to form the gate interconnect structure 224 in the opening 602. In some implementations, the plating tool 112 performs a plating operation such as an electroplating operation to form the gate interconnect structure 224 in the first portion of the opening 602. In some implementations, the deposition tool 102 performs a deposition operation to deposit a seed layer in the opening 602 to promote adhesion of the sidewalls 606 and the deposition tool 102 performs another deposition operation (or the plating tool 112) performs a plating operation to fill in the remaining portion of the gate interconnect structure 224 over the seed layer. In some implementations, one or more barrier layers, liners, and/or other conformal layers may be deposited in the opening 602 prior to formation of the gate interconnect structure 224 to promote adhesion, reduce contact resistance, and/or reduce copper migration, among other examples.

Figure 6E:
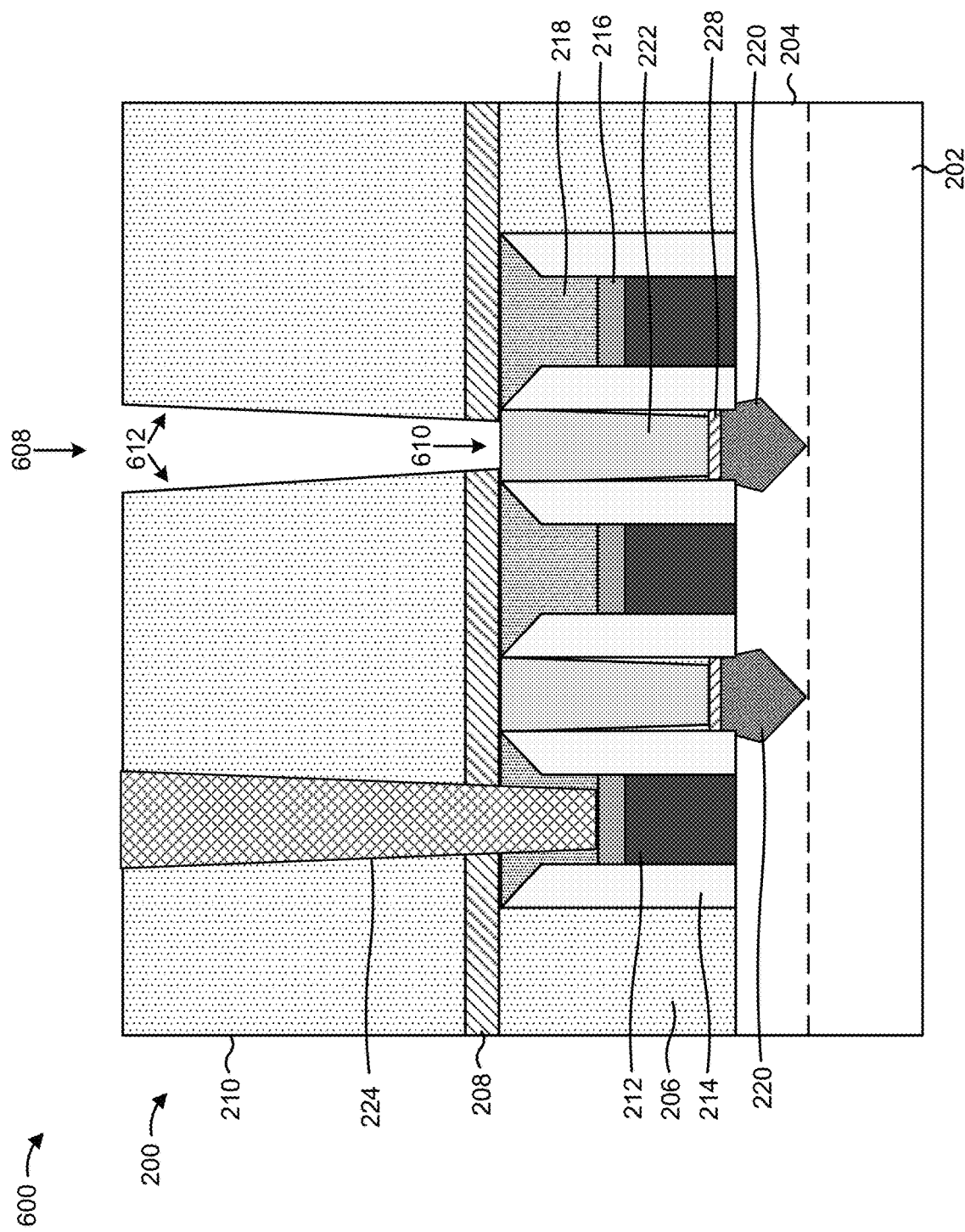

As shown in FIG. 6E, another opening (or another recess) 608 is formed in the dielectric layer 210 and in the ESL 208. In particular, the opening 608 is formed in and through the dielectric layer 210, in and through the ESL 208, and to a conductive layer (e.g., a metal layer, a metal contact) such as a source/drain contact 222. As shown in FIG. 6E, the opening 608 includes a bottom surface 610 (which corresponds to the top surface of the source/drain contact 222) and sidewalls 612 (which correspond to the ESL 208 and the dielectric layer 210).

In some implementations, a pattern in a photoresist layer is used to etch the dielectric layer 210 and the ESL 208 to form the opening 608. In these implementations, the deposition tool 102 forms the photoresist layer on the dielectric layer 210. The exposure tool 104 exposes the photoresist layer to a radiation source to pattern the photoresist layer. The developer tool 106 develops and removes portions of the photoresist layer to expose the pattern. The etch tool 108 etches the dielectric layer 210 and the ESL 208 based on the pattern to form the opening 608. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for etching the opening 608 based on a pattern.

Figure 6F:
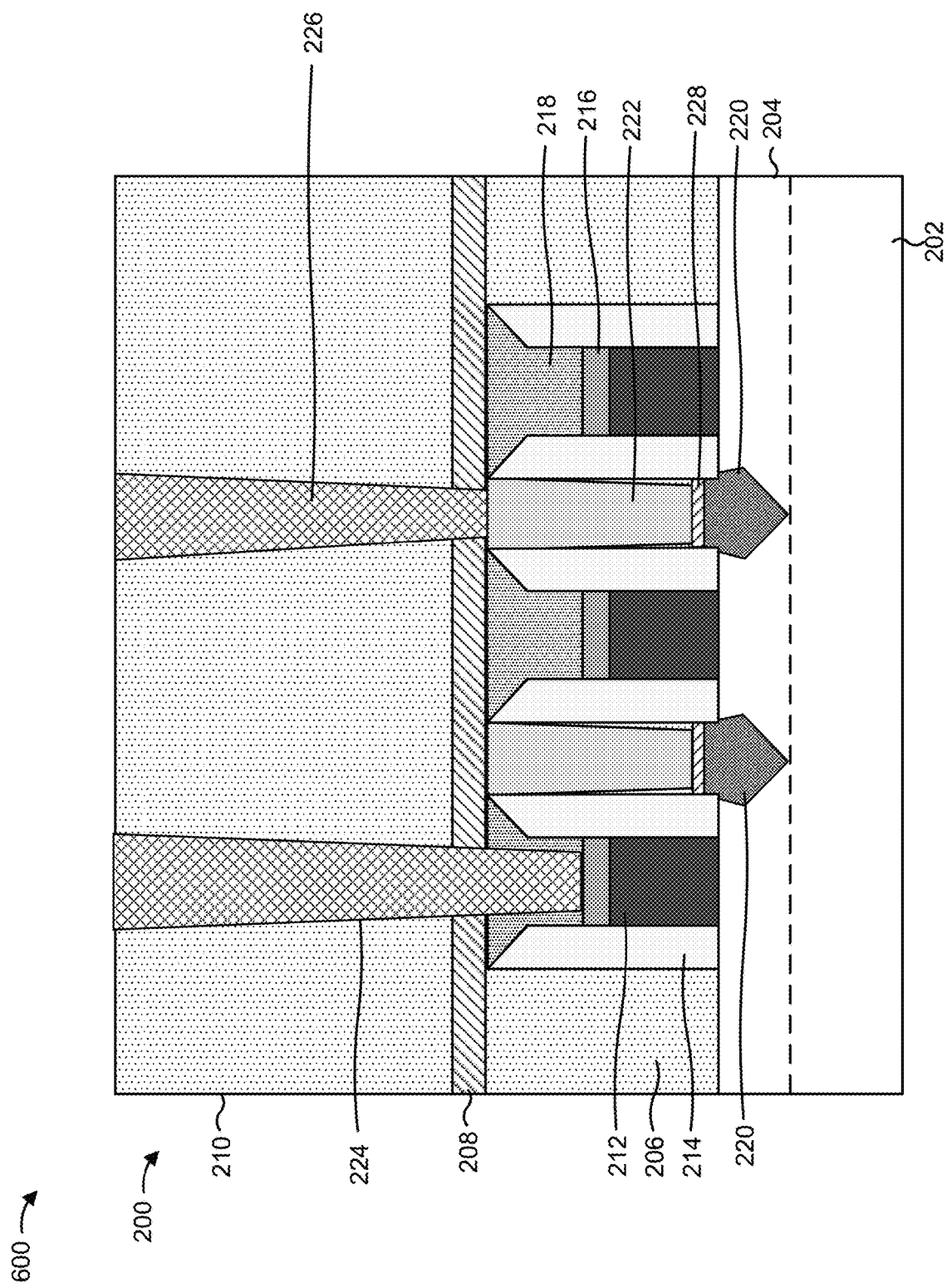

As shown in FIG. 6F, the opening 608 is filled with a conductive material (or a conductive material composition) to form a source/drain interconnect structure 226 in the opening 608. In particular, the conductive material is deposited over the source/drain contact 222 in the opening 608. In some implementations, the deposition tool 102 performs a PVD operation, a CVD operation, or another type of deposition operation to form the source/drain interconnect structure 226 in the opening 608. In some implementations, the plating tool 112 performs a plating operation such as an electroplating operation to form the source/drain interconnect structure 226 in the first portion of the opening 608. In some implementations, the deposition tool 102 performs a deposition operation to deposit a seed layer in the opening 608 to promote adhesion of the sidewalls 612 and the deposition tool 102 performs another deposition operation (or the plating tool 112) performs a plating operation to fill in the remaining portion of the source/drain interconnect structure 226 over the seed layer. In some implementations, one or more barrier layers, liners, and/or other conformal layers may be deposited in the opening 608 prior to formation of the source/drain interconnect structure 226 to promote adhesion, reduce contact resistance, and/or reduce copper migration, among other examples.

As indicated above, FIGS. 6A-6F are provided as one or more examples. Other examples may differ from what is described with regard to FIGS. 6A-6F.

Figure 7A:
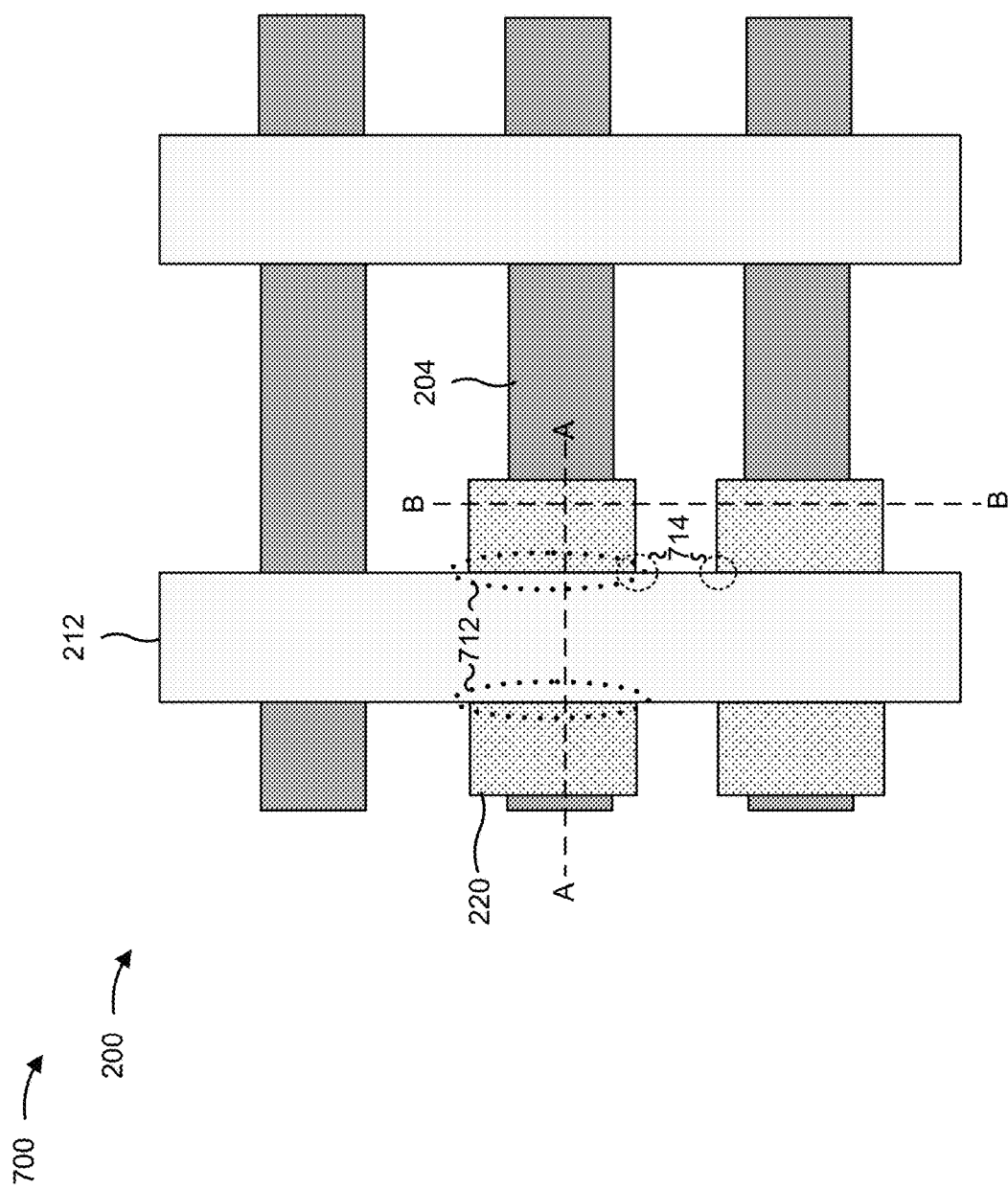
FIGS. 7A-7C are diagrams of an example semiconductor device described herein.
Figure 7B:
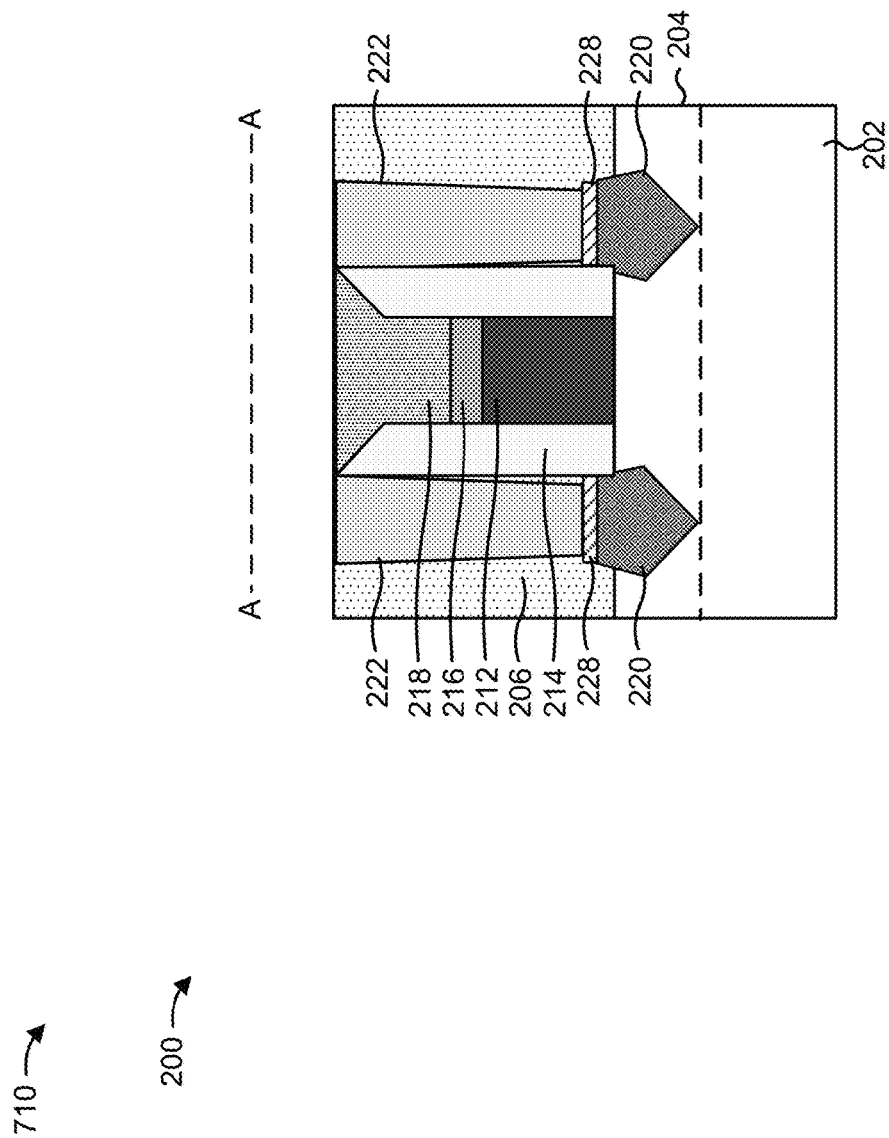
Figure 7C:
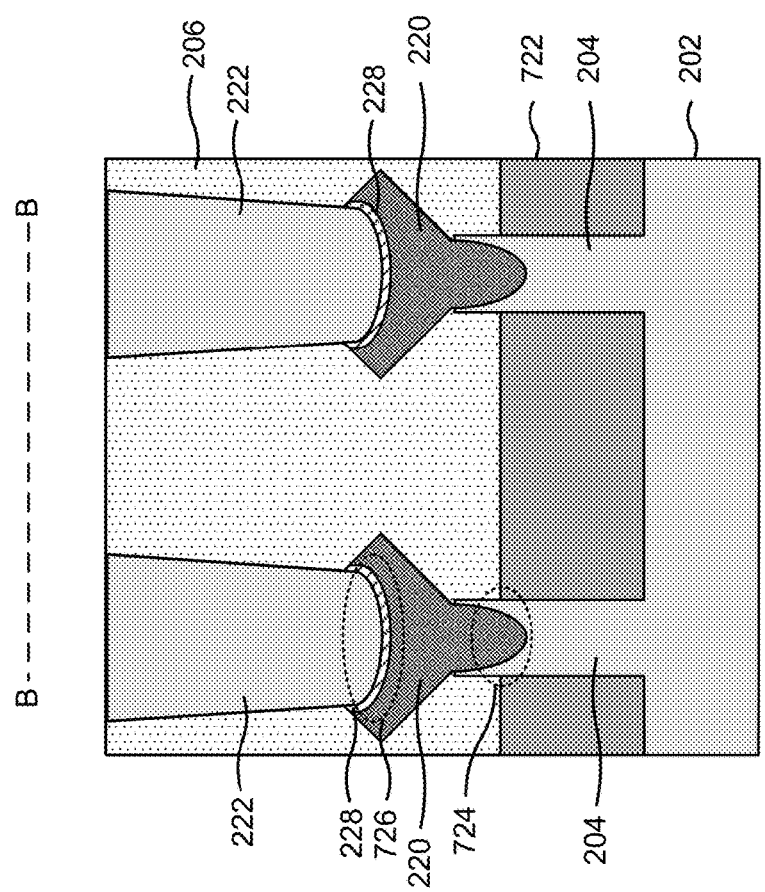

FIGS. 7A-7C are diagrams of the example semiconductor device 200 described herein. FIG. 7A illustrates an example 700 of a top-down view of the semiconductor device 200. FIG. 7B illustrates an example 710 of a cross-sectional view of the semiconductor device 200. FIG. 7C illustrates an example 720 of another cross-sectional view of the semiconductor device 200.

As shown in the top-down view in FIG. 7A, the semiconductor device 200 includes a plurality of fin structures 204. The fin structures 204 are arranged in an approximately parallel configuration in which the fin structures 204 extend in a first direction of the semiconductor device 200. A portion of one or more of the fin structures 204 may function as a switching channel for a transistor included in the semiconductor device 200. Accordingly, in some implementations, transistors included in the semiconductor device 200 include finFETs, nanostructure transistors, and/or another type of fin-based transistors.

The semiconductor device 200 includes one or more metal gate structures 212 of the transistors included in the semiconductor device 200. The one or more metal gate structures 212 extend in a second direction that is approximately perpendicular to the first direction of the fin structures 204. Moreover, the one or more metal gate structures 212 surround portions of the fin structures 204 on at least three sides of the fin structures 204 to provide increased switching channel control of the transistors included in the semiconductor device 200. In some implementations, the semiconductor device 200 includes a plurality of metal gate structures 212 that extend approximately parallel to one another in the second direction.

Source/drain regions 220 are included in and/or on portions of one or more of the fin structures 204. In particular, the source/drain regions 220 may be included in and/or on portions that are not covered by the one or more metal gate structures 212. The source/drain regions 220 function as source or drain regions for the transistors included in the semiconductor device 200. In some implementations, a source/drain region 220 is located between two metal gate structures 212. In some implementations, a source/drain region 220 is located adjacent to and/or side-by-side with a single metal gate structure 212.

Areas 712 and 714 illustrated in FIG. 7A are areas of the semiconductor device 200 in which a potential for chopping or clipping of dielectric capping layers 218 may occur. The use of the protection layer 410 in the pre-cleaning operation described herein may reduce the likelihood of chopping or clipping of dielectric capping layers 218 in the areas 712 and 714 (and other areas of the semiconductor device 200).

FIG. 7A further illustrates reference cross-sections that are used in FIGS. 7B and 7C. Cross-section A-A is in a plane along a channel in a fin structure 204 between opposing source/drain regions 220. Cross-section B-B is in a plane perpendicular to cross-section A-A, and is across source/drain regions 220 in and/or on different (e.g., adjacent and/or side-by-side) fin structures 204.

FIG. 7B is an example 710 illustrating a cross-sectional view along the line A-A of FIG. 7A. FIG. 7B illustrates various details of the source/drain regions 220 and associated source/drain contacts 222, as well as a gate stack between the source/drain regions 220, in a portion of the semiconductor device 200. The gate stack includes a metal gate structure 212 between sidewall spacers 214, a metal capping layer 216 over and/or on the metal gate structure 212, and a dielectric capping layer 218 over and/or on the metal capping layer 216.

The use of the protection layer 410 in the pre-cleaning operation described herein may reduce the likelihood of gate-to-source/drain leakage and/or shorting between the gate stack and the source/drain regions 220 illustrated in the example 710 in FIG. 7B. The use of the protection layer 410 may reduce chopping or clipping of a dielectric capping layer 218 over the metal gate structure 212 that is adjacent to and/or side-by-side with the source/drain regions 220. Chopping or clipping of a dielectric capping layer 218 might otherwise cause the edges (e.g., in the areas 712 illustrated in FIG. 7A) of the source/drain contacts 222 that face the gate stack to protrude toward the gate stack. Accordingly, the use of the protection layer 410 in the pre-cleaning operation described herein may increase the electrical isolation between the gate stack and the source/drain regions 220, and between the gate stack and the source/drain contacts 222 illustrated in the example 710 in FIG. 7B, which may increase the performance of the semiconductor device 200 and may enable transistor sizes in the semiconductor device 200 to be reduced, among other examples.

FIG. 7C is an example 720 illustrating a cross-sectional view along the line B-B of FIG. 7A. FIG. 7C illustrates various details of the fin structures 204, the source/drain regions 220, and associated source/drain contacts 222 in a portion of the semiconductor device 200.

As shown in FIG. 7C, the fin structures 204 extend from the substrate 202 of the semiconductor device 200. The areas between the fin structures 204 are filled with shallow trench isolation (STI) regions 722. The STI regions 722 provide electrical isolation between the fin structures 204 and include a dielectric material such as a silicon oxide ($SiO_x$) and/or another dielectric material.

As further shown in FIG. 7C, portions of the source/drain regions 220 are filled in recessed portions 724 of the fin structures 204, and the remaining portions of the source/drain regions 220 extend above the recessed portions 724 of the fin structures 204. The source/drain regions 220 may be covered by the dielectric layer 206 on one or more sides when viewed in the cross-sectional view along the line B-B.

As further shown in FIG. 7C, the source/drain contacts 222 may be included over the source/drain regions 220. The metal silicide layers 228 may be included between the source/drain regions 220 and the source/drain contacts 222. In some implementations, the source/drain contacts 222 may be formed in a recessed portion 726 in the source/drain regions 220. The recessed portion 726 may be formed when etching the dielectric layer 206 to form a recess or an opening to the source/drain regions 220 to enable the source/drain contacts 222 to be electrically connected to the source/drain region 220. Accordingly, the metal silicide layers 228 may be included in the recessed portion 726 of the source/drain regions 220.

The use of the protection layer 410 in the pre-cleaning operation described herein may reduce the likelihood of source/drain-to-source/drain leakage and/or shorting between the source/drain regions 220 illustrated in the example 720 in FIG. 7C. The use of the protection layer 410 may reduce chopping or clipping of a dielectric capping layer 218 over the metal gate structure 212 that is adjacent to and/or side-by-side with both of the source/drain regions 220. Chopping or clipping of a dielectric capping layer 218 might otherwise cause the corners of the source/drain contacts 222 (e.g., in the areas 714 illustrated in FIG. 7A), that face each other and also face the metal gate structure 212, to protrude toward each other. Accordingly, the use of the protection layer 410 in the pre-cleaning operation described herein may increase the electrical isolation between the source/drain regions 220 and between the source/drain contacts 222 illustrated in the example 720 in FIG. 7C, which may increase the performance of the semiconductor device 200 and may enable transistor sizes in the semiconductor device 200 to be reduced, among other examples.

As indicated above, FIGS. 7A-7C are provided as examples. Other examples may differ from what is described with regard to FIGS. 7A-7C.

Figure 8:
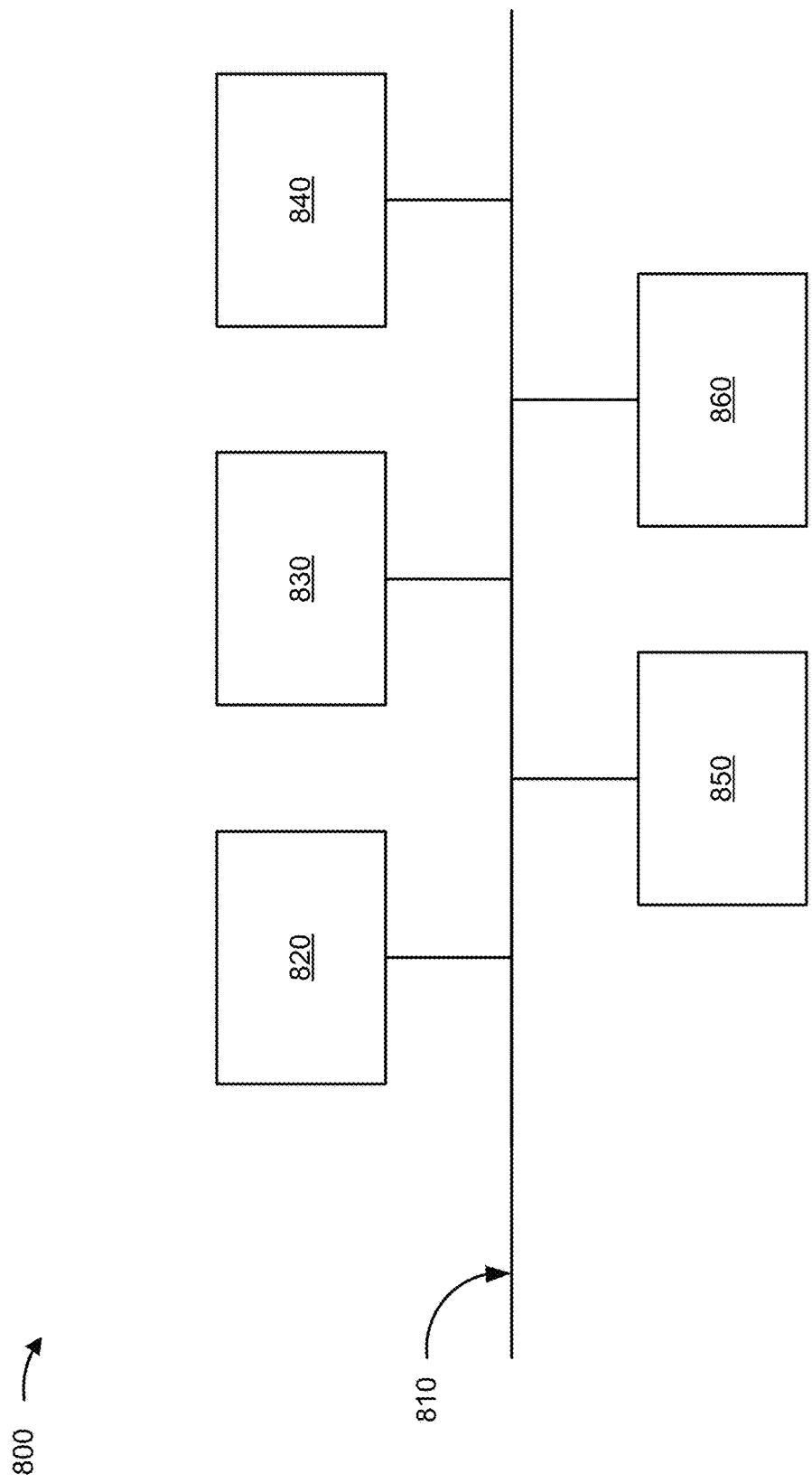
FIG. 8 is a diagram of example components of one or more devices of FIG. 1 described herein.

FIG. 8 is a diagram of example components of a device 800. In some implementations, one or more of the semiconductor processing tools 102-114 and/or the wafer/die transport tool 116 include one or more devices 800 and/or one or more components of device 800. As shown in FIG. 8, device 800 may include a bus 810, a processor 820, a memory 830, an input component 840, an output component 850, and a communication component 860.

Bus 810 includes one or more components that enable wired and/or wireless communication among the components of device 800. Bus 810 may couple together two or more components of FIG. 8, such as via operative coupling, communicative coupling, electronic coupling, and/or electric coupling. Processor 820 includes a central processing unit, a graphics processing unit, a microprocessor, a controller, a microcontroller, a digital signal processor, a field-programmable gate array, an application-specific integrated circuit, and/or another type of processing component. Processor 820 is implemented in hardware, firmware, or a combination of hardware and software. In some implementations, processor 820 includes one or more processors capable of being programmed to perform one or more operations or processes described elsewhere herein.

Memory 830 includes volatile and/or nonvolatile memory. For example, memory 830 may include random access memory (RAM), read only memory (ROM), a hard disk drive, and/or another type of memory (e.g., a flash memory, a magnetic memory, and/or an optical memory). Memory 830 may include internal memory (e.g., RAM, ROM, or a hard disk drive) and/or removable memory (e.g., removable via a universal serial bus connection). Memory 830 may be a non-transitory computer-readable medium. Memory 830 stores information, instructions, and/or software (e.g., one or more software applications) related to the operation of device 800. In some implementations, memory 830 includes one or more memories that are coupled to one or more processors (e.g., processor 820), such as via bus 810.

Input component 840 enables device 800 to receive input, such as user input and/or sensed input. For example, input component 840 may include a touch screen, a keyboard, a keypad, a mouse, a button, a microphone, a switch, a sensor, a global positioning system sensor, an accelerometer, a gyroscope, and/or an actuator. Output component 850 enables device 800 to provide output, such as via a display, a speaker, and/or a light-emitting diode. Communication component 860 enables device 800 to communicate with other devices via a wired connection and/or a wireless connection. For example, communication component 860 may include a receiver, a transmitter, a transceiver, a modem, a network interface card, and/or an antenna.

Device 800 may perform one or more operations or processes described herein. For example, a non-transitory computer-readable medium (e.g., memory 830) may store a set of instructions (e.g., one or more instructions or code) for execution by processor 820. Processor 820 may execute the set of instructions to perform one or more operations or processes described herein. In some implementations, execution of the set of instructions, by one or more processors 820, causes the one or more processors 820 and/or the device 800 to perform one or more operations or processes described herein. In some implementations, hardwired circuitry is used instead of or in combination with the instructions to perform one or more operations or processes described herein. Additionally, or alternatively, processor 820 may be configured to perform one or more operations or processes described herein. Thus, implementations described herein are not limited to any specific combination of hardware circuitry and software.

The number and arrangement of components shown in FIG. 8 are provided as an example. Device 800 may include additional components, fewer components, different components, or differently arranged components than those shown in FIG. 8. Additionally, or alternatively, a set of components (e.g., one or more components) of device 800 may perform one or more functions described as being performed by another set of components of device 800.

Figure 9:
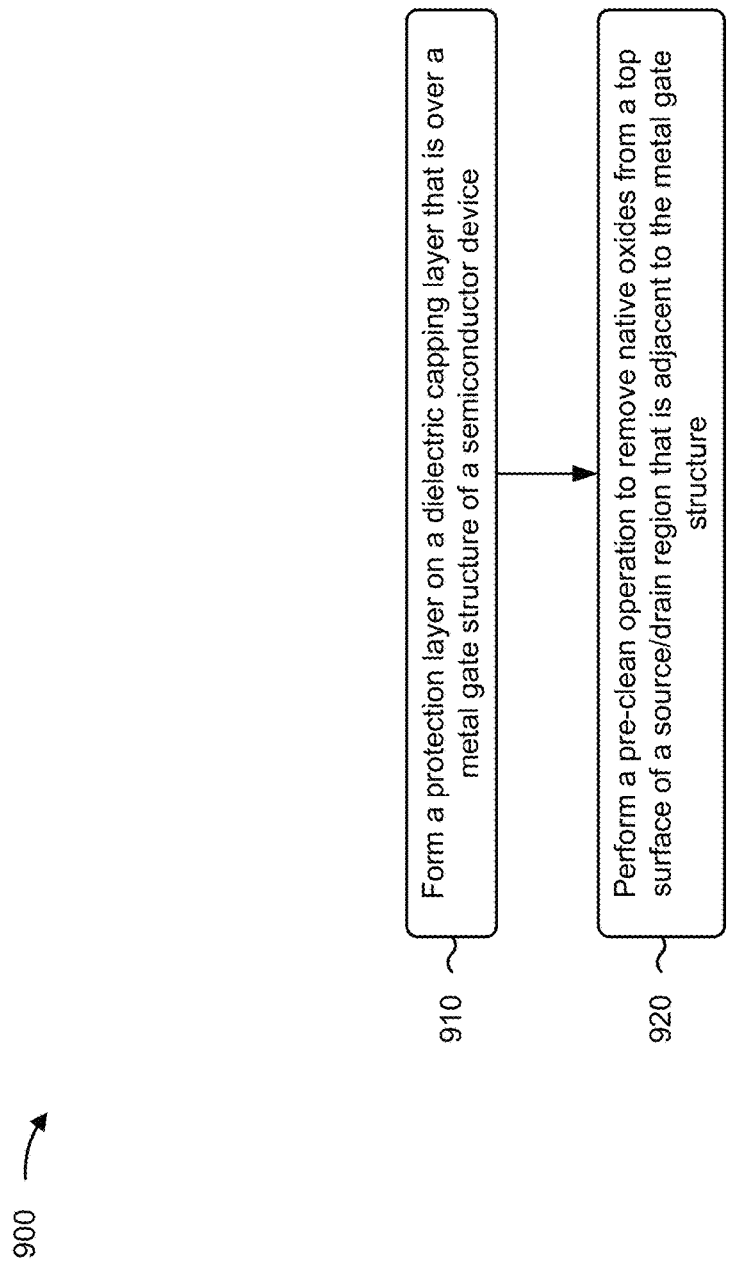
FIGS. 9-11 are flowcharts of example processes associated with performing a pre-clean operation described herein.

FIG. 9 is a flowchart of an example process 900 associated with semiconductor device pre-cleaning. In some implementations, one or more process blocks of FIG. 9 are performed by one or more semiconductor processing tools (e.g., one or more of the semiconductor processing tools 102-114). Additionally, or alternatively, one or more process blocks of FIG. 9 may be performed by one or more components of device 800, such as processor 820, memory 830, input component 840, output component 850, and/or communication component 860.

As shown in FIG. 9, process 900 may include forming a protection layer on a dielectric capping layer that is over a metal gate structure of a semiconductor device (block 910). For example, one or more of the semiconductor processing tools 102-114 may form a protection layer 410 on a dielectric capping layer 218 that is over a metal gate structure 212 of a semiconductor device 200, as described herein.

As further shown in FIG. 9, process 900 may include performing a pre-clean operation to remove native oxides from a top surface of a source/drain region that is side-by-side with the metal gate structure (block 920). For example, one or more of the semiconductor processing tools 102-114 may perform a pre-clean operation to remove native oxides 404 from a top surface of a source/drain region 220 that is side-by-side with the metal gate structure 212, as described herein. In some implementations, the protection layer 410 resists removal of material from the dielectric capping layer 218 during the pre-clean operation.

Process 900 may include additional implementations, such as any single implementation or any combination of implementations described below and/or in connection with one or more other processes described elsewhere herein.

In a first implementation, the protection layer 410 includes a silicon-containing material. In a second implementation, alone or in combination with the first implementation, the protection layer 410 is at least partially removed from the dielectric capping layer 218 during the pre-clean operation. In a third implementation, alone or in combination with one or more of the first and second implementations, forming the protection layer 410 includes forming the protection layer 410 on sidewall spacers 214 associated with the metal gate structure 212, and the protection layer 410 is removed from the sidewall spacers 214 during the pre-clean operation. In a fourth implementation, alone or in combination with one or more of the first through third implementations, forming the protection layer 410 includes performing a deposition operation, at a pressure that is included in a range of approximately 500 millitorr to approximately 30,000 millitorr, to form the protection layer 410.

In a fifth implementation, alone or in combination with one or more of the first through fourth implementations, forming the protection layer 410 includes performing a plasma-assisted deposition operation to form the protection layer 410, where a bias power that is used in the plasma-assisted deposition operation is included in a range of approximately 100 watts to approximately 5,000 watts. In a sixth implementation, alone or in combination with one or more of the first through fifth implementations, forming the protection layer 410 includes forming the protection layer 410 to a thickness on the dielectric capping layer 218 such that the protection layer 410 is not fully removed from the dielectric capping layer 218 prior to completion of the pre-clean operation.

Although FIG. 9 shows example blocks of process 900, in some implementations, process 900 includes additional blocks, fewer blocks, different blocks, or differently arranged blocks than those depicted in FIG. 9. Additionally, or alternatively, two or more of the blocks of process 900 may be performed in parallel.

Figure 10:
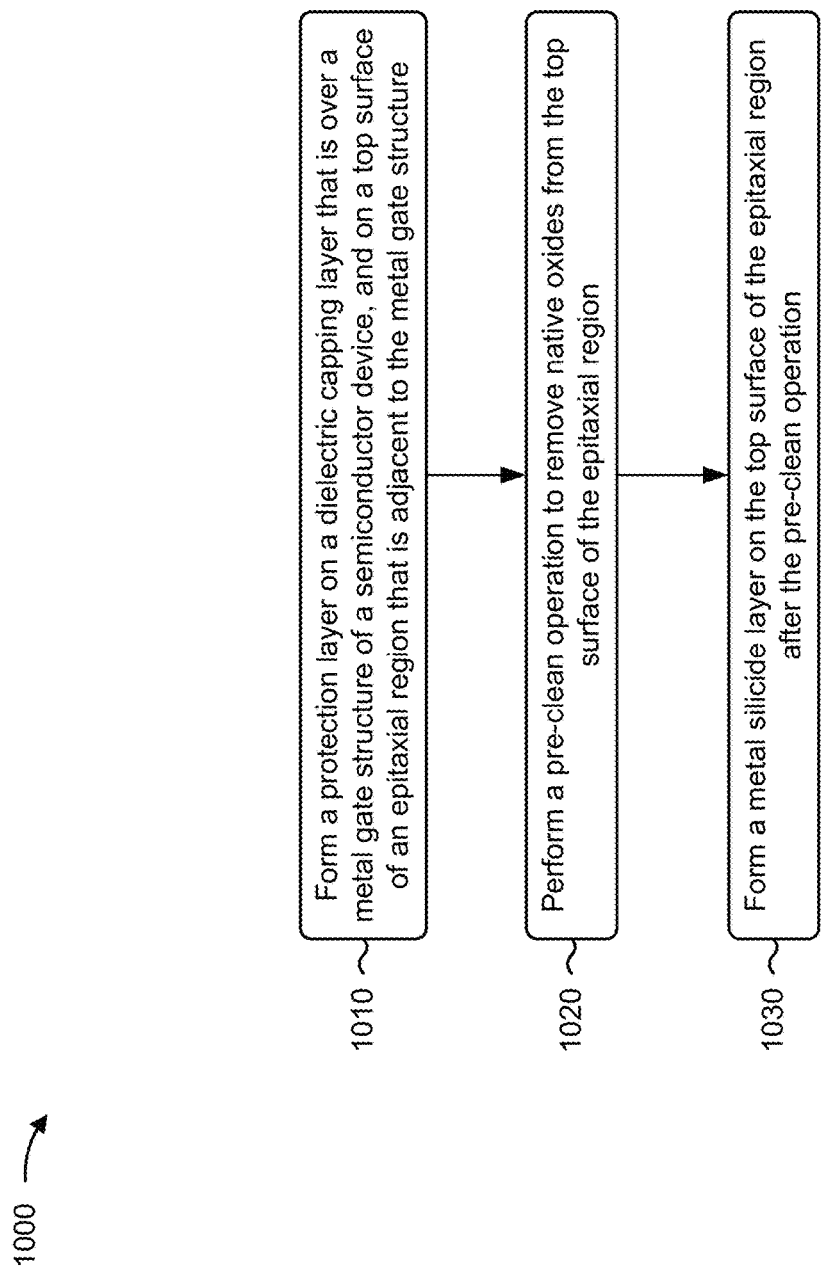

FIG. 10 is a flowchart of an example process 1000 associated with semiconductor device pre-cleaning. In some implementations, one or more process blocks of FIG. 10 are performed by one or more semiconductor processing tools (e.g., one or more of the semiconductor processing tools 102-114). Additionally, or alternatively, one or more process blocks of FIG. 10 may be performed by one or more components of device 800, such as processor 820, memory 830, input component 840, output component 850, and/or communication component 860.

As shown in FIG. 10, process 1000 may include forming a protection layer on a dielectric capping layer that is over a metal gate structure of a semiconductor device, and on a top surface of an epitaxial region that is side-by-side with the metal gate structure (block 1010). For example, one or more of the semiconductor processing tools 102-114 may form a protection layer 410 on a dielectric capping layer 218 that is over a metal gate structure 212 of a semiconductor device 200, and on a top surface of an epitaxial region (e.g., a source/drain region 220) that is side-by-side with the metal gate structure 212, as described herein.

As further shown in FIG. 10, process 1000 may include performing a pre-clean operation to remove native oxides from the top surface of the epitaxial region (block 1020). For example, one or more of the semiconductor processing tools 102-114 may perform a pre-clean operation to remove native oxides 404 from the top surface of the epitaxial region, as described herein. In some implementations, the protection layer 410 is removed from the top surface of the epitaxial region during the pre-clean operation to expose the top surface of the epitaxial region to enable the native oxides 404 to be removed from the top surface of the epitaxial region during the pre-clean operation. In some implementations, the protection layer 410 resists removal of material from the dielectric capping layer 218 during the pre-clean operation.

As further shown in FIG. 10, process 1000 may include forming a metal silicide layer on the top surface of the epitaxial region after the pre-clean operation (block 1030). For example, one or more of the semiconductor processing tools 102-114 may form a metal silicide layer 228 on the top surface of the epitaxial region after the pre-clean operation, as described herein.

Process 1000 may include additional implementations, such as any single implementation or any combination of implementations described below and/or in connection with one or more other processes described elsewhere herein.

In a first implementation, forming the protection layer 410 includes providing a flow of one or more precursor gasses 406 into a processing chamber of a deposition tool 102, providing a flow of one or more reactant gasses 408 into the processing chamber of the deposition tool 102, and causing a reaction between the one or more precursor gasses 406 and the one or more reactant gasses 408, wherein the reaction results in material of the protection layer being deposited onto the dielectric capping layer 218 and onto the top surface of the epitaxial region. In a second implementation, alone or in combination with the first implementation, providing the flow of the one or more precursor gasses 406 into the processing chamber includes providing the flow of the one or more precursor gasses 406 into the processing chamber at a flow rate that is in a range of approximately 50 sccm to approximately 1,000 sccm.

In a third implementation, alone or in combination with one or more of the first and second implementations, forming the protection layer 410 includes forming the protection layer 410 such that a thickness of the protection layer 410 on the dielectric capping layer 218 is greater relative to a thickness of the protection layer 410 on the top surface of the epitaxial region. In a fourth implementation, alone or in combination with one or more of the first through third implementations, forming the protection layer 410 such that the thickness of the protection layer 410 on the dielectric capping layer 218 is greater relative to the thickness of the protection layer 410 on the top surface of the epitaxial region enables at least a portion of the protection layer 410 on the dielectric capping layer 218 to remain after the pre-clean operation.

In a fifth implementation, alone or in combination with one or more of the first through fourth implementations, forming the protection layer 410 such that the thickness of the protection layer 410 on the dielectric capping layer 218 is greater relative to the thickness of the protection layer 410 on the top surface of the epitaxial region enables the protection layer 410 to be fully removed from the top surface of the epitaxial region during the pre-clean operation. In a sixth implementation, alone or in combination with one or more of the first through fifth implementations, forming the protection layer 410 includes performing a deposition operation, at a temperature that is included in a range of approximately 20 degrees Celsius to approximately 500 degrees Celsius, to form the protection layer 410.

Although FIG. 10 shows example blocks of process 1000, in some implementations, process 1000 includes additional blocks, fewer blocks, different blocks, or differently arranged blocks than those depicted in FIG. 10. Additionally, or alternatively, two or more of the blocks of process 1000 may be performed in parallel.

Figure 11:
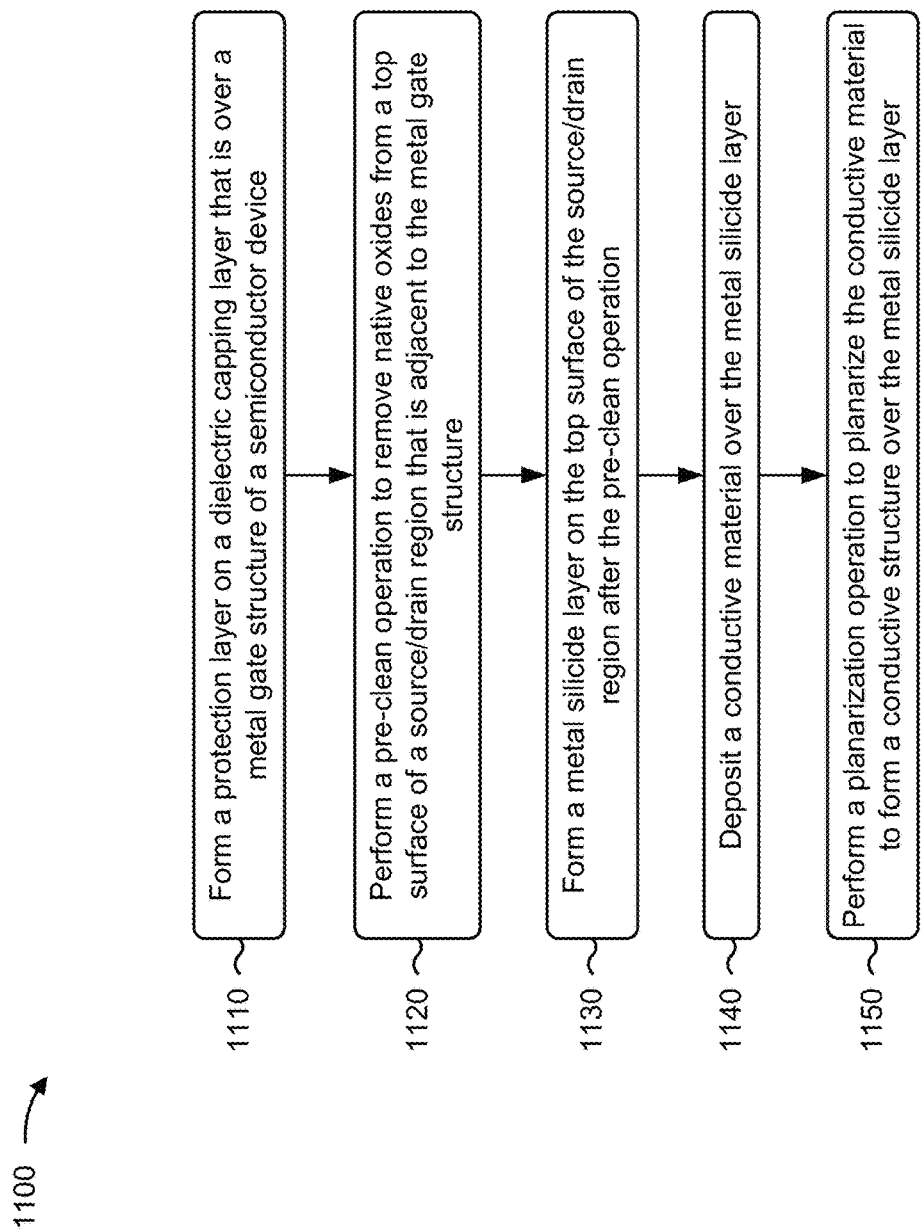

FIG. 11 is a flowchart of an example process 1100 associated with semiconductor device pre-cleaning. In some implementations, one or more process blocks of FIG. 11 are performed by one or more semiconductor processing tools (e.g., one or more of the semiconductor processing tools 102-114). Additionally, or alternatively, one or more process blocks of FIG. 11 may be performed by one or more components of device 800, such as processor 820, memory 830, input component 840, output component 850, and/or communication component 860.

As shown in FIG. 11, process 1100 may include forming a protection layer on a dielectric capping layer that is over a metal gate structure of a semiconductor device (block 1110). For example, one or more of the semiconductor processing tools 102-114 may form a protection layer 410 on a dielectric capping layer 218 that is over a metal gate structure 212 of a semiconductor device 200, as described herein.

As further shown in FIG. 11, process 1100 may include performing a pre-clean operation to remove native oxides from a top surface of a source/drain region that is side-by-side with the metal gate structure (block 1120). For example, one or more of the semiconductor processing tools 102-114 may perform a pre-clean operation to remove native oxides 404 from a top surface of a source/drain region 220 that is side-by-side with the metal gate structure 212, as described herein. In some implementations, the protection layer 410 resists removal of material from the dielectric capping layer 218 during the pre-clean operation.

As further shown in FIG. 11, process 1100 may include forming a metal silicide layer on the top surface of the source/drain region after the pre-clean operation (block 1130). For example, one or more of the semiconductor processing tools 102-114 may form a metal silicide layer 228 on the top surface of the source/drain region 220 after the pre-clean operation, as described herein.

As further shown in FIG. 11, process 1100 may include depositing a conductive material over the metal silicide layer (block 1140). For example, one or more of the semiconductor processing tools 102-114 may deposit a conductive material 502 over the metal silicide layer 228, as described herein.

As further shown in FIG. 11, process 1100 may include performing a planarization operation to planarize the conductive material to form a conductive structure over the metal silicide layer (block 1150). For example, one or more of the semiconductor processing tools 102-114 may perform a planarization operation to planarize the conductive material 502 to form a conductive structure (e.g., a source/drain contact 222) over the metal silicide layer 228, as described herein. In some implementations, the protection layer 410 is removed from the dielectric capping layer 218 during the planarization operation.

Process 1100 may include additional implementations, such as any single implementation or any combination of implementations described below and/or in connection with one or more other processes described elsewhere herein.

In a first implementation, forming the protection layer 410 includes forming the protection layer 410 on sidewall spacers 214 associated with the metal gate structure 212, where the protection layer 410 is formed such that a thickness of the protection layer 410 on the dielectric capping layer 218 is greater relative to a thickness of the protection layer 410 on the sidewall spacers 214. In a second implementation, alone or in combination with the first implementation, forming the protection layer 410 such that the thickness of the protection layer 410 on the dielectric capping layer 218 is greater relative to the thickness of the protection layer 410 on the sidewall spacers 214 enables the protection layer 410 to be fully removed from the sidewall spacers 214 during the pre-clean operation. In a third implementation, alone or in combination with one or more of the first and second implementations, forming the protection layer 410 such that the thickness of the protection layer 410 on the dielectric capping layer 218 is greater relative to the thickness of the protection layer 410 on the sidewall spacers 214 enables at least a portion of the protection layer 410 on the dielectric capping layer 218 to remain after the pre-clean operation.

In a fourth implementation, alone or in combination with one or more of the first through third implementations, forming the protection layer 410 includes forming the protection layer 410 on the top surface of the source/drain region 220, where the protection layer 410 is fully removed from the top surface of the source/drain region 220 prior to completion of the pre-clean operation. In a fifth implementation, alone or in combination with one or more of the first through fourth implementations, the native oxides 404 are removed from the top surface of the source/drain region 220, and the protection layer 410 is fully removed from the top surface of the source/drain region 220, using a same one or more pre-clean chemicals 412 in the pre-clean operation.

Although FIG. 11 shows example blocks of process 1100, in some implementations, process 1100 includes additional blocks, fewer blocks, different blocks, or differently arranged blocks than those depicted in FIG. 11. Additionally, or alternatively, two or more of the blocks of process 1100 may be performed in parallel.

Figure 12A:
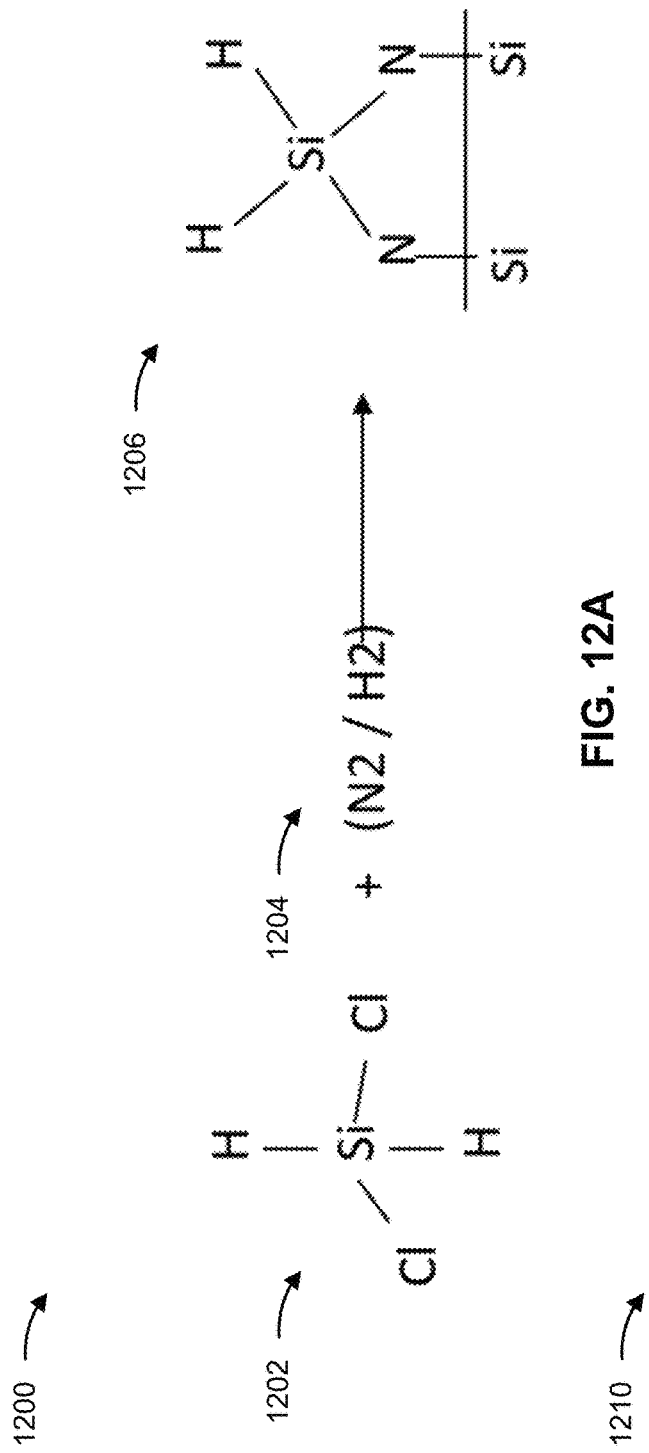
FIGS. 12A, 12B, 13A, and 13B are diagrams of example reactions described herein.
Figure 12B:
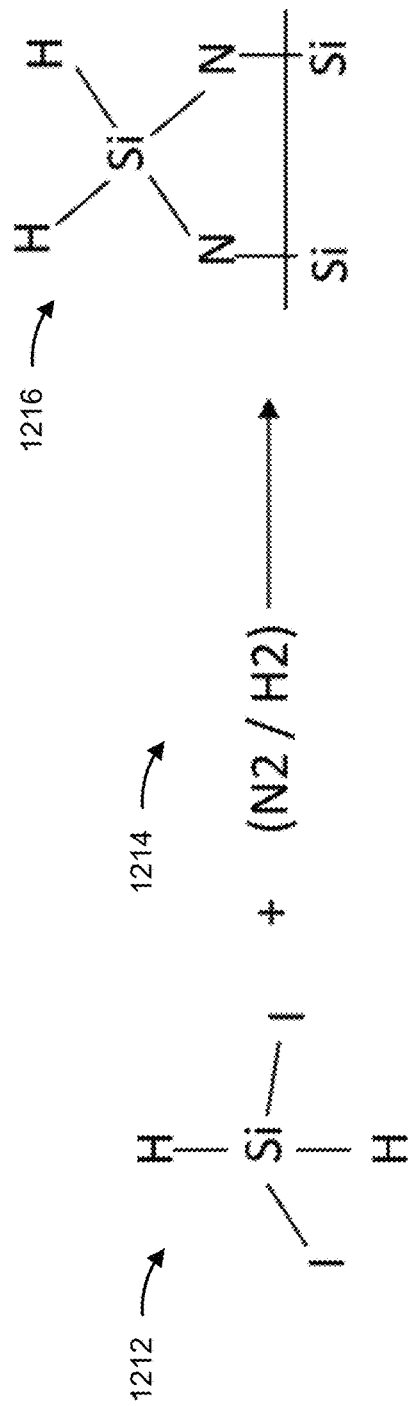

FIGS. 12A and 12B are diagrams of reactions described herein. The reactions that are illustrated and described in connection with FIGS. 12A and 12B are examples of reactions between the one or more precursor gasses 406 and the one or more reactant gasses 408 in the deposition operation described above in connection with FIGS. 4D and 4E to form the protection layer 410 described herein. However, other precursors, reactants, and/or reactions may be used to form the protection layer 410 described herein.

FIG. 12A illustrates an example 1200 of a reaction between a silicon nitride ($Si_xN_y$) precursor 1202 and reactants 1204 to form a protection layer 410 that includes silicon nitride 1206. The silicon nitride precursor 1202 includes dichlorosilane ($SiH_2Cl_2$), and the reactants 1204 include nitrogen ($N_2$) and hydrogen ($H_2$). The reaction results in formation of the silicon nitride 1206 and one or more byproducts. The one or more byproducts may include, for example, hydrochloric acid (HCl).

FIG. 12B illustrates an example 1210 of another reaction between a silicon nitride ($Si_xN_y$) precursor 1212 and reactants 1214 to form a protection layer 410 that includes silicon nitride 1216. The silicon nitride precursor 1212 includes diiodosilane ($SiH_2I_2$), and the reactants 1214 include nitrogen ($N_2$) and hydrogen ($H_2$). The reaction results in formation of the silicon nitride 1216 and one or more byproducts. The one or more byproducts may include, for example, hydroiodic acid (HI).

As indicated above, FIGS. 12A and 12B are provided as examples. Other examples may differ from what is described with regard to FIGS. 12A and 12B.

Figure 13A:
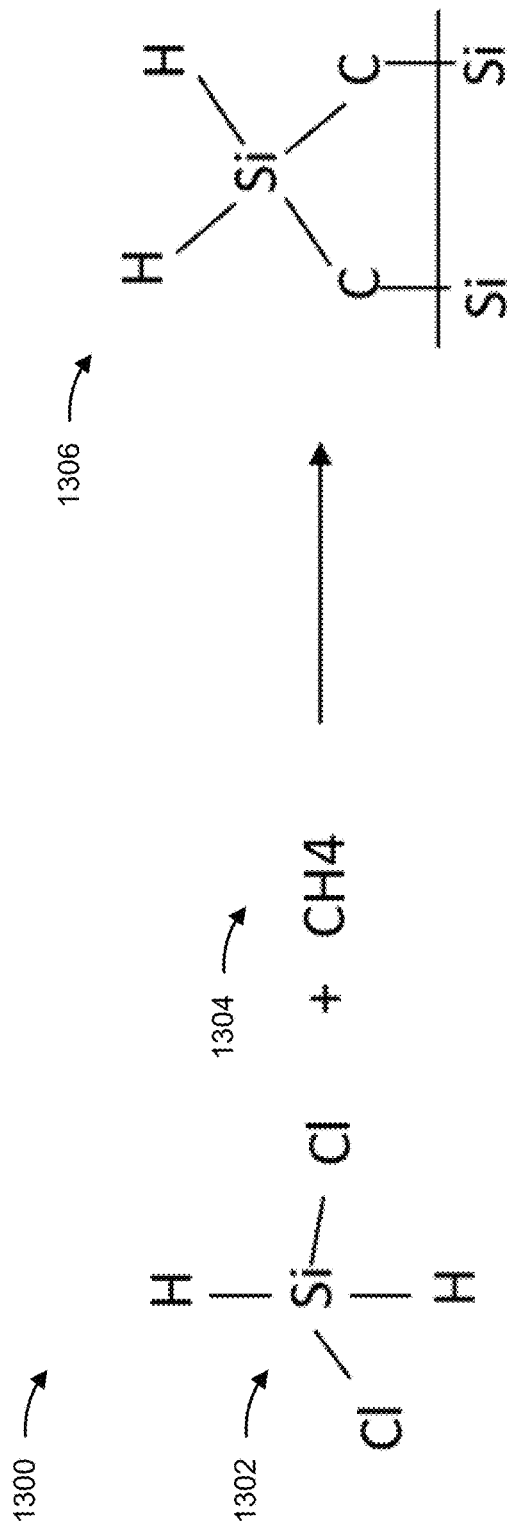
Figure 13B:
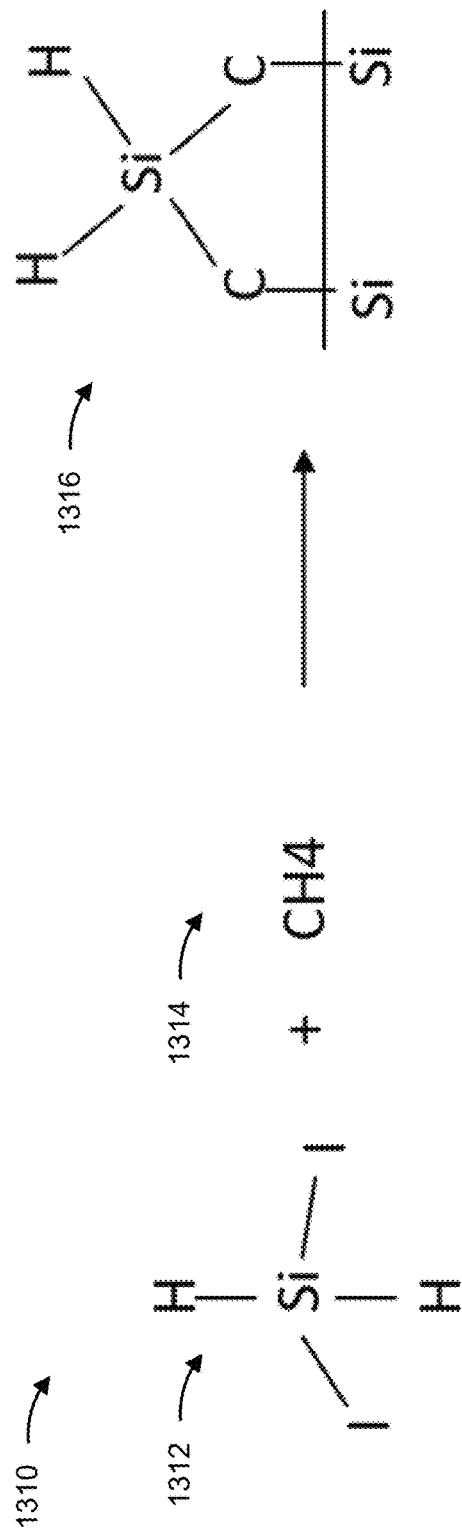

FIGS. 13A and 13B are diagrams of reactions described herein. The reactions that are illustrated and described in connection with FIGS. 13A and 13B are examples of reactions between the one or more precursor gasses 406 and the one or more reactant gasses 408 in the deposition operation described above in connection with FIGS. 4D and 4E to form the protection layer 410 described herein. However, other precursors, reactants, and/or reactions may be used to form the protection layer 410 described herein.

FIG. 13A illustrates an example 1300 of a reaction between a silicon carbide (SiC) precursor 1302 and a reactant 1304 to form a protection layer 410 that includes silicon carbide 1306. The silicon carbide precursor 1302 includes dichlorosilane ($SiH_2Cl_2$), and the reactant 1304 includes methane ($CH_4$). The reaction results in formation of the silicon carbide 1306 and one or more byproducts. The one or more byproducts may include, for example, hydrochloric acid (HCl).

FIG. 13B illustrates an example 1310 of another reaction between a silicon carbide (SiC) precursor 1312 and a reactant 1314 to form a protection layer 410 that includes silicon nitride 1216. The silicon nitride precursor 1212 includes diiodosilane ($SiH_2I_2$), and the reactant 1314 includes methane ($CH_4$). The reaction results in formation of the silicon carbide 1316 and one or more byproducts. The one or more byproducts may include, for example, hydroiodic acid (HI).

As indicated above, FIGS. 13A and 13B are provided as examples. Other examples may differ from what is described with regard to FIGS. 13A and 13B.

Figure 14:
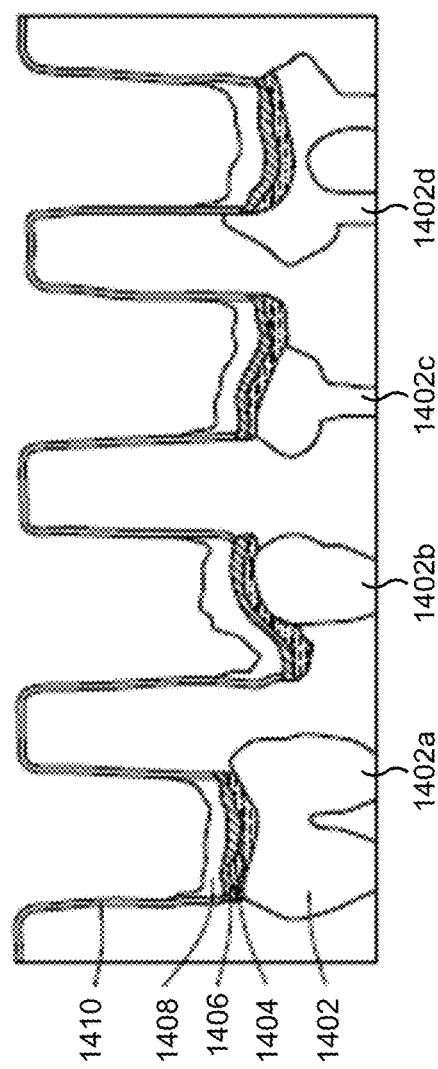
FIG. 14 is a diagram of example source/drain regions described herein.

FIG. 14 is a diagram of example source/drain regions described herein. As shown in FIG. 14, a semiconductor device may include a plurality of source/drain regions 1402, a metal silicide layer 1404 over the source/drain regions 1402, a metal barrier layer 1406 on the metal silicide layer 1404, a metal oxide layer 1408 on the metal barrier layer 1406, and a liner 1410 on the metal oxide layer 1408.

A source/drain region 1402a may include a merged epitaxial structure having two or more merged epitaxial regions. A source/drain region 1402b may include a non-merged (e.g., a singular) epitaxial structure. The metal silicide layer 1404, the metal barrier layer 1406, and the metal oxide layer 1408 may be positioned off center on the source/drain region 1402b. Accordingly, the metal silicide layer 1404, the metal barrier layer 1406, and the metal oxide layer 1408 may at least partially extend down a side of the source/drain region 1402b, as shown in the example in FIG. 14.

A source/drain region 1402c may include a non-merged (e.g., a singular) epitaxial structure. The metal silicide layer 1404, the metal barrier layer 1406, and the metal oxide layer 1408 may be positioned off center on the source/drain region 1402c. Accordingly, the metal silicide layer 1404, the metal barrier layer 1406, and the metal oxide layer 1408 may at least partially extend down a side of the source/drain region 1402c, as shown in the example in FIG. 14. The source/drain region 1402c also includes a stem region under a main epitaxial region.

A source/drain region 1402d may include a merged epitaxial structure having two or more merged main epitaxial regions and stem regions under the main epitaxial regions. The metal silicide layer 1404, the metal barrier layer 1406, and the metal oxide layer 1408 are partially recessed into the merged main epitaxial regions for the source/drain region 1402d.

As indicated above, FIG. 14 is provided as an example. Other examples may differ from what is described with regard to FIG. 14.

In this way, a pre-cleaning technique described herein may be used to remove native oxides and/or other contaminants from a semiconductor device in a manner in which the likelihood of chopping, clipping, and/or sidewall spacer thickness reduction is reduced. As described herein, a protection layer is formed on a capping layer over a gate structure of a transistor. A pre-cleaning operation is then performed to remove native oxides from the top surface of a source/drain region of the transistor. In the pre-cleaning operation, the protection layer is consumed instead of the material of the capping layer. In this way, the use of the protection layer reduces the likelihood of removal of material from the capping layer and/or reduces the amount of material that is removed from the capping layer during the pre-cleaning operation. Accordingly, the use of the protection layer may reduce the occurrence of chopping or clipping in the capping layer, which may enable the capping layer to provide increased electrical isolation as a result of a reduced likelihood of a source/drain contact protrusion forming in the transistor. Moreover, the protection layer may also be formed on the sidewall spacers of the gate structure, and may protect the sidewall spacers from being thinned during the pre-cleaning operations. This may enable the sidewall spacers to provide increased electrical isolation in the transistor. The increased electrical isolation may reduce current leakage in the transistor and may reduce the likelihood of gate-to-source/drain shorting or source/drain-to-source/drain shorting, which may increase yield of transistors formed on a substrate or wafer.

As described in greater detail above, some implementations described herein provide a method. The method includes forming a protection layer on a dielectric capping layer that is over a metal gate structure of a semiconductor device. The method includes performing a pre-clean operation to remove native oxides from a top surface of a source/drain region that is side-by-side with the metal gate structure, where the protection layer resists removal of material from the dielectric capping layer during the pre-clean operation. The protection layer is at least partially removed from the dielectric capping layer during the pre-clean operation.

As described in greater detail above, some implementations described herein provide a method. The method includes forming a protection layer on a dielectric capping layer that is over a metal gate structure of a semiconductor device, and on a top surface of an epitaxial region that is side-by-side with the metal gate structure. The method includes performing a pre-clean operation to remove native oxides from the top surface of the epitaxial region, where the protection layer is removed from the top surface of the epitaxial region during the pre-clean operation to expose the top surface of the epitaxial region to enable the native oxides to be removed from the top surface of the epitaxial region during the pre-clean operation, and where the protection layer resists removal of material from the dielectric capping layer during the pre-clean operation. The method includes forming a metal silicide layer on the top surface of the epitaxial region after the pre-clean operation.

As described in greater detail above, some implementations described herein provide a method. The method includes forming a protection layer on a dielectric capping layer that is over a metal gate structure of a semiconductor device. The method includes performing a pre-clean operation to remove native oxides from a top surface of a source/drain region that is side-by-side with the metal gate structure, where the protection layer resists removal of material from the dielectric capping layer during the pre-clean operation. The method includes forming a metal silicide layer on the top surface of the source/drain region after the pre-clean operation. The method includes depositing a conductive material over the metal silicide layer. The method includes performing a planarization operation to planarize the conductive material to form a conductive structure over the metal silicide layer, where the protection layer is removed from the dielectric capping layer during the planarization operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a protection layer on a dielectric capping layer, that is over a metal gate structure of a semiconductor device, and on a top surface of an epitaxial region adjacent to the metal gate structure;
    performing a pre-clean operation to remove native oxides from the top surface of the epitaxial region,
       wherein the protection layer is removed from the top surface of the epitaxial region during the pre-clean operation to expose the top surface of the epitaxial region to enable the native oxides to be removed from the top surface of the epitaxial region during the pre-clean operation, and
       wherein a portion of the protection layer remains on the dielectric capping layer after the protection layer is completely removed from the top surface of the epitaxial region; and
    forming a metal silicide layer on the top surface of the epitaxial region after the pre-clean operation.

2. The method of claim 1, wherein forming the protection layer comprises:
    providing a flow of one or more precursor gasses into a processing chamber of a deposition tool;
    providing a flow of one or more reactant gasses into the processing chamber of the deposition tool; and
    causing a reaction between the one or more precursor gasses and the one or more reactant gasses,
       wherein the reaction results in material of the protection layer being deposited onto the dielectric capping layer and onto the top surface of the epitaxial region.

3. The method of claim 2, wherein providing the flow of the one or more precursor gasses into the processing chamber comprises:
    providing the flow of the one or more precursor gasses into the processing chamber at a flow rate that is in a range of approximately 50 standard cubic centimeters per minute (sccm) to approximately 1,000 sccm.

4. The method of claim 1, wherein forming the protection layer comprises:
    forming the protection layer such that a thickness of the protection layer on the dielectric capping layer is greater relative to a thickness of the protection layer on the top surface of the epitaxial region.

5. The method of claim 4, wherein forming the protection layer such that the thickness of the protection layer on the dielectric capping layer is greater relative to the thickness of the protection layer on the top surface of the epitaxial region enables the portion of the protection layer on the dielectric capping layer to remain after the pre-clean operation.

6. The method of claim 4, wherein forming the protection layer such that the thickness of the protection layer on the dielectric capping layer is greater relative to the thickness of the protection layer on the top surface of the epitaxial region enables the protection layer to be fully removed from the top surface of the epitaxial region during the pre-clean operation.

7. The method of claim 1, wherein forming the protection layer comprises:
    performing a deposition operation, at a temperature that is included in a range of approximately 20 degrees Celsius to approximately 500 degrees Celsius, to form the protection layer.

8. A method, comprising:
    forming a protection layer on a dielectric capping layer that is over a metal gate structure of a semiconductor device;
    performing a pre-clean operation to remove native oxides from a top surface of a source/drain region that is side-by-side with the metal gate structure,
       wherein a portion of the protection layer on the dielectric capping layer remains after preforming the pre-clean operation;
    forming a metal silicide layer on the top surface of the source/drain region after the pre-clean operation;
    depositing a conductive material over the metal silicide layer; and
    performing a planarization operation to planarize the conductive material to form a conductive structure over the metal silicide layer,
       wherein the portion of the protection layer is removed from the dielectric capping layer during the planarization operation.

9. The method of claim 8, wherein forming the protection layer comprises:
    forming the protection layer on sidewall spacers associated with the metal gate structure,
       wherein the protection layer is formed such that a thickness of the protection layer on the dielectric capping layer is greater relative to a thickness of the protection layer on the sidewall spacers.

10. The method of claim 9, wherein forming the protection layer such that the thickness of the protection layer on the dielectric capping layer is greater relative to the thickness of the protection layer on the sidewall spacers enables the protection layer to be fully removed from the sidewall spacers during the pre-clean operation.

11. The method of claim 9, wherein forming the protection layer such that the thickness of the protection layer on the dielectric capping layer is greater relative to the thickness of the protection layer on the sidewall spacers enables the portion of the protection layer on the dielectric capping layer to remain after the pre-clean operation.

12. The method of claim 8, wherein forming the protection layer comprises:

forming the protection layer on the top surface of the source/drain region,
  wherein the protection layer is fully removed from the top surface of the source/drain region prior to completion of the pre-clean operation.

13. The method of claim 12, wherein the native oxides are removed from the top surface of the source/drain region, and the protection layer is fully removed from the top surface of the source/drain region, using a same one or more pre-clean chemicals in the pre-clean operation.

14. A method, comprising:
  forming a protection layer on a dielectric capping layer that is over a metal gate structure of a semiconductor device;
  performing a pre-clean operation to remove native oxides from a top surface of a source/drain region that is side-by-side with the metal gate structure, wherein a portion of the protection layer remains on the dielectric capping layer after the pre-clean operation is performed;
  forming a metal silicide layer on the top surface of the source/drain region after the pre-clean operation; and
  forming a conductive material over the metal silicide layer; and
  forming a conductive structure over the metal silicide layer.

15. The method of claim 14, wherein the protection layer comprises a silicon-containing material.

16. The method of claim 14, wherein forming the protection layer comprises:
  forming the protection layer on sidewall spacers associated with the metal gate structure,
    wherein the protection layer is removed from the sidewall spacers during the pre-clean operation.

17. The method of claim 14, wherein forming the protection layer comprises:
  performing a deposition operation, at a pressure that is included in a range of approximately 500 millitorr to approximately 30,000 millitorr, to form the protection layer.

18. The method of claim 14, wherein forming the protection layer comprises:
  performing a plasma-assisted deposition operation to form the protection layer.

19. The method of claim 18, wherein a bias power that is used in the plasma-assisted deposition operation is included in a range of approximately 100 watts to approximately 5,000 watts.

20. The method of claim 14, wherein forming the protection layer comprises:
  forming the protection layer to a thickness on the dielectric capping layer such that the protection layer is not fully removed from the dielectric capping layer prior to completion of the pre-clean operation.

* * * * *